(12) United States Patent
Choi et al.

(10) Patent No.: US 11,574,593 B2
(45) Date of Patent: Feb. 7, 2023

(54) LIGHT EMITTING DISPLAY PANEL

(71) Applicant: LG Display Co., Ltd., Seoul (KR)

(72) Inventors: JeongHyeon Choi, Paju-si (KR); Sul Lee, Paju-si (KR); Eunil Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 178 days.

(21) Appl. No.: 17/082,796

(22) Filed: Oct. 28, 2020

(65) Prior Publication Data

US 2021/0125561 A1 Apr. 29, 2021

(30) Foreign Application Priority Data

Oct. 28, 2019 (KR) .................. 10-2019-0134397

(51) Int. Cl.
| | |
|---|---|
| *G09G 5/00* | (2006.01) |
| *G09G 3/3258* | (2016.01) |
| *G09G 3/20* | (2006.01) |
| *G09G 3/3266* | (2016.01) |
| *G09G 3/3291* | (2016.01) |
| *H01L 27/32* | (2006.01) |
| *H01L 51/52* | (2006.01) |

(52) U.S. Cl.
CPC ......... *G09G 3/3258* (2013.01); *G09G 3/2092* (2013.01); *G09G 3/3266* (2013.01); *G09G 3/3291* (2013.01); *H01L 27/3258* (2013.01); *H01L 27/3265* (2013.01); *H01L 51/5237* (2013.01)

(58) Field of Classification Search
CPC ... G09G 2300/0819; G09G 2300/0852; G09G 2300/0861; G09G 2300/0876; G09G 2310/0262; G09G 2320/0233; G09G 2320/043; G09G 3/3233
See application file for complete search history.

(56) References Cited

U.S. PATENT DOCUMENTS

| | | | |
|---|---|---|---|
| 10,700,098 B2 | 6/2020 | Takahashi et al. | |
| 2018/0026218 A1* | 1/2018 | Kobayashi | G09G 3/3413 |
| | | | 349/143 |
| 2018/0218677 A1* | 8/2018 | Qing | G09G 3/3233 |
| 2018/0286307 A1 | 10/2018 | Kim et al. | |
| 2019/0252479 A1 | 8/2019 | Kang et al. | |

FOREIGN PATENT DOCUMENTS

| | | |
|---|---|---|
| KR | 10-2013-0053657 A | 5/2013 |
| KR | 10-2013-0065232 A | 6/2013 |
| KR | 10-2018-0015574 A | 2/2018 |

* cited by examiner

*Primary Examiner* — Insa Sadio
(74) *Attorney, Agent, or Firm* — Seed IP Law Group LLP

(57) ABSTRACT

A light emitting display panel having a high resolution is provided. The light emitting display panel includes a plurality of pixels. Each of the plurality of pixels includes a first pixel circuit layer, a second pixel circuit layer, and a light emitting device layer. The first pixel circuit layer includes a first pixel circuit that includes a first layer electrode. The second pixel circuit layer includes a second pixel circuit that includes a second layer electrode which configures a first capacitor along with the first layer electrode. The light emitting device layer includes a light emitting device electrically connected to a driving transistor provided in the second pixel circuit layer.

18 Claims, 13 Drawing Sheets

LIGHT EMITTING DISPLAY PANEL

CROSS-REFERENCE TO RELATED APPLICATIONS

This application claims the benefit of the Korean Patent Application No. 10-2019-0134397 filed on Oct. 28, 2019, which is hereby incorporated by reference as if fully set forth herein.

BACKGROUND

Technical Field

The present disclosure relates to a light emitting display panel.

Description of the Related Art

Since light emitting display apparatuses display an image by using a self-emitting device, the light emitting display apparatuses have a fast response time, low power consumption, and a good viewing angle, and thus, are attracting much attention as next-generation display apparatuses.

Each of a plurality of pixels of a light emitting display panel configuring a light emitting display apparatus includes a pixel driving circuit. The pixel driving circuit controls a level of a current flowing from a driving power source to a light emitting device on the basis of switching of a driving transistor based on a data voltage, thereby allowing the light emitting device to emit light. Therefore, the light emitting display apparatus displays a certain image.

In the light emitting display panel, a current flowing in the light emitting device of each pixel may vary based on a deviation of a threshold voltage of the driving transistor caused by a process deviation. Therefore, even when the same data voltages are supplied to pixel driving circuits of the light emitting display panel, a current output from the driving transistor may vary for each pixel, and due to this, uniform image quality may not be realized. Therefore, an internal compensation circuit for compensating for the threshold voltage of the driving transistor is included in the each of the pixel driving circuits.

Recently, a light emitting display panel applied to mobile electronic devices, virtual image display apparatuses, or head-mounted display apparatuses is progressively increasing in resolution. As a resolution of a light emitting display panel increases progressively, a size of each pixel is progressively reduced. Therefore, it is difficult to form (or place) a pixel driving circuit, including an internal compensation circuit, in a pixel, and due to this, it is difficult to manufacture a high-resolution light emitting display panel.

BRIEF SUMMARY

Accordingly, the present disclosure is directed to providing a light emitting display panel that substantially obviates one or more problems due to limitations and disadvantages of the related art.

An aspect of the present disclosure is directed to providing a light emitting display panel having a high resolution.

Additional benefits and features of the disclosure will be set forth in part in the description which follows and in part will become apparent to those having ordinary skill in the art upon examination of the following or may be learned from practice of the disclosure. The advantages of the disclosure may be realized and attained by the structure particularly pointed out in the written description and claims hereof as well as the appended drawings.

To achieve these and other technical benefits and in accordance with the purpose of the disclosure, as embodied and broadly described herein, there is provided a light emitting display panel including a plurality of pixels, wherein each of the plurality of pixels includes a first pixel circuit layer including a first pixel circuit including a first layer electrode, a second pixel circuit layer including a second pixel circuit including a second layer electrode which configures a first capacitor along with the first layer electrode, and a light emitting device layer including a light emitting device electrically connected to a driving transistor provided in the second pixel circuit layer.

It is to be understood that both the foregoing general description and the following detailed description of the present disclosure are explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
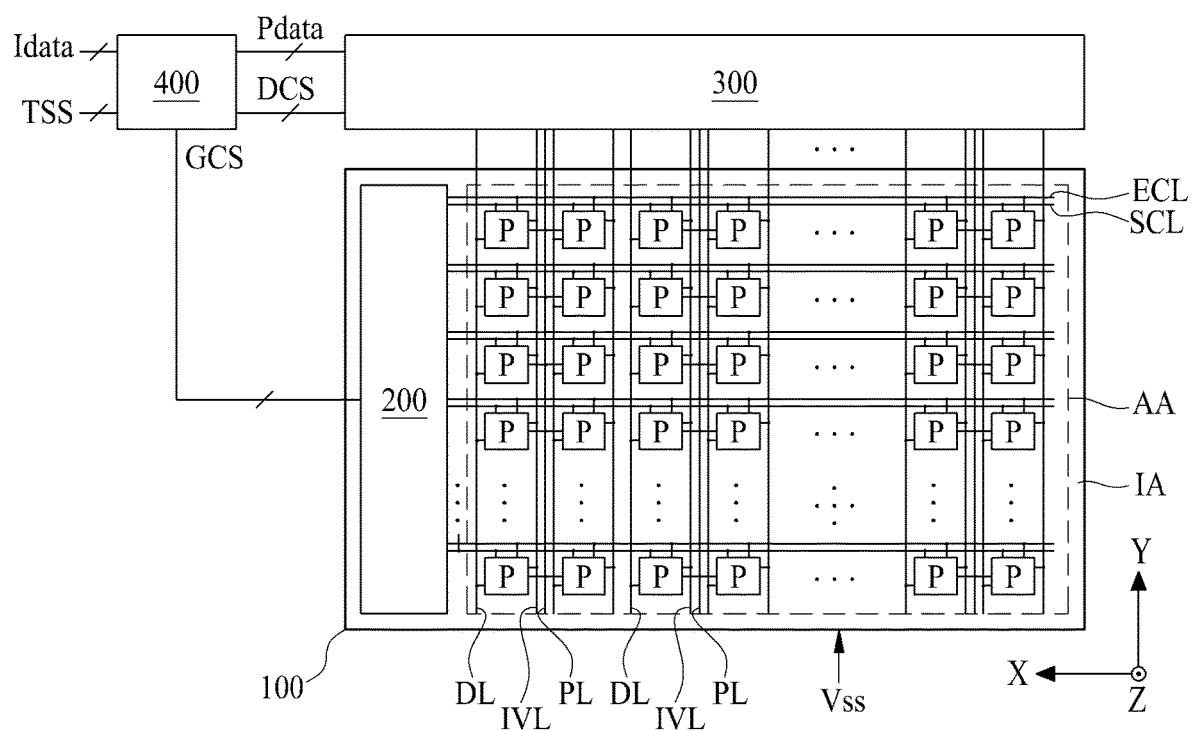
FIG. 1 is a diagram schematically illustrating a light emitting display apparatus to which a light emitting display panel according to an embodiment of the present disclosure is applied.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

FIG. 1 is a diagram schematically illustrating a light emitting display apparatus to which a light emitting display panel according to an embodiment of the present disclosure is applied.

The light emitting display apparatus to which a light emitting display panel according to an embodiment of the present disclosure is applied, as illustrated in FIG. 1, may include a light emitting display panel 100, a gate driver 200, a data driver 300, and a timing controller 400.

The light emitting display panel 100 may include a substrate, a display area AA defined on the substrate, and a non-display area IA adjacent to the display area AA.

The substrate may be a base substrate (or a base layer) and may include a plastic material or a glass material. The substrate according to an embodiment may have a flat tetragonal shape, a tetragonal shape where each corner portion is rounded at a certain curvature radius, or a non-tetragonal shape including at least seven sides. Here, the substrate having a non-tetragonal shape may include at least one protrusion portion or at least one notch portion.

The substrate according to an embodiment may include a colored polyimide material. For example, the substrate including a polyimide material may be formed by curing a polyimide resin which is coated to have a certain thickness on a front surface of a release layer provided in a relatively thick carrier substrate. In this case, the carrier substrate may be separated from the substrate by releasing the release layer through a laser release process. The substrate according to an embodiment may further include a back plate coupled to a rear surface of the substrate with respect to a thickness direction Z. The back plate may maintain the substrate in a flat state. The back plate according to an embodiment may include a plastic material, and for example, may include polyethylene terephthalate. The back plate may be laminated on the rear surface of the substrate separated from the carrier substrate.

According to another embodiment, the substrate may be a flexible glass substrate. For example, the substrate including a glass material may be a thin glass substrate having a thickness of 100 μm or less, or may be a carrier glass substrate which has been etched to have a thickness of 100 μm or less through a substrate etching process performed after a manufacturing process is completed.

A plurality of initialization voltage lines IVL, a plurality of scan control lines SCL, a plurality of emission control lines ECL, a plurality of data lines DL, a plurality of pixel driving voltage lines PL, a common electrode layer, and a plurality of pixels P may be provided in the display area AA.

The plurality of initialization voltage lines IVL may extend long in a second direction Y intersecting with a first direction X and may be apart from one another in the first direction X. Here, the first direction X may be a direction parallel to a widthwise direction of the substrate and the second direction Y may be a direction parallel to a lengthwise direction of the substrate. However, the present disclosure is not limited thereto, and the first direction X may be a direction parallel to the lengthwise direction of the substrate and the second direction Y may be a direction parallel to the widthwise direction of the substrate. Each of the plurality of initialization voltage lines IVL may transfer an initialization voltage, supplied from the data driver 300 or a power supply circuit, to a corresponding pixel among the plurality of pixels.

The plurality of scan control lines SCL may extend long in the first direction X and may be respectively disposed adjacent to the plurality of emission control lines ECL. Each of the plurality of scan control lines SCL may transfer a scan control signal, supplied from the gate driver 200, to a corresponding pixel among the plurality of pixels.

The plurality of emission control lines ECL may extend long in the first direction X and may be disposed in parallel with the plurality of scan control lines SCL. Each of the plurality of emission control lines ECL may transfer an emission control signal, supplied from the gate driver 200, to a corresponding pixel among the plurality of pixels.

The plurality of data lines DL may extend long in the second direction Y and may be apart from one another in the first direction X. Each of the plurality of data lines DL may transfer a data voltage, supplied from the data driver 300, to a corresponding pixel among the plurality of pixels.

The plurality of pixel driving voltage lines PL may be respectively disposed in parallel with the plurality of data lines DL. Each of the plurality of pixel driving voltage lines PL may transfer a pixel driving voltage, supplied from the data driver 300 or the power supply circuit, to a corresponding pixel among the plurality of pixels.

Each of the plurality of pixel driving voltage lines PL according to an embodiment may be disposed to correspond to two pixels each disposed adjacent to each other in the first direction X. That is, one pixel driving voltage line PL may be disposed to be shared by two pixels disposed adjacent to each other in the first direction X.

The common electrode layer may be disposed the whole display area AA. The common electrode layer may transfer a common voltage Vss, supplied from the data driver 300 or the power supply circuit, to the plurality of pixels. At least one common power supply line electrically connected to the common electrode layer may be provided in the display area AA.

Each of the plurality of pixels P may be disposed in a pixel area defined in the display area AA and may be electrically connected to a corresponding initialization voltage line IVL, a corresponding scan control line SCL, a corresponding emission control line ECL, a corresponding data line DL, a pixel driving voltage line PL, and the common electrode layer, which pass through the pixel area or are disposed near the pixel area.

In this case, in order to implement the light emitting display panel 100 having a high resolution, each of the scan control line SCL and the emission control line ECL may be disposed to pass through or by the pixel area, and each of the initialization voltage line IVL, the data line DL, and the pixel driving voltage line PL may be disposed at an outer portion of the pixel area. Also, two pixels disposed adjacent to each other in the first direction X may have a symmetrical structure with respect to the pixel driving voltage line PL.

The pixels P according to an embodiment may be disposed to a stripe structure in the display area AA. In this case, one unit pixel may include red pixel, a green pixel, and a blue pixel, and moreover, may further include white pixel.

According to another embodiment, the pixels P may be disposed to have a pentile structure in the display area AA. In this case, one unit pixel may include at least one red pixel, at least two green pixels, and at least one blue pixel, which are arranged to one-dimensionally have a polygonal shape.

For example, one unit pixel having the pentile structure may be disposed so that one red pixel, two green pixels, and one blue pixel are arranged to one-dimensionally have an octagonal shape, and in this case, the blue pixel may include an opening area (or an emission area) having a relatively largest size and the green pixel may include an opening area having a relatively smallest size.

Each of the plurality of pixels P may operate in the order of an initialization period, a sampling period, and an emission period to emit light having luminance corresponding to a data voltage supplied through a corresponding data line DL.

In some embodiments, the non-display area IA may be provided along an edge of the substrate to surround the display area AA. One non-display region of the non-display area IA may include a pad part.

The pad part may be disposed in one non-display area of the substrate and may be electrically connected to lines disposed in the display area AA in the second direction Y. Also, the pad part may be electrically connected to the data driver 300.

The timing controller 400 may align input video data Idata on the basis of driving of the light emitting display panel 100 to generate pixel data Pdata, generate a data control signal DCS on the basis of a timing synchronization signal TSS, and provide the pixel data Pdata and the data control signal DCS to the data driver 300.

The timing controller 400 may generate a gate control signal GCS including a gate start signal and a plurality of gate shift clocks on the basis of the timing synchronization signal TSS and may provide the gate control signal GCS to the gate driver 200. The gate control signal GCS may be provided to the gate driver 200 via the pad part.

The data driver 300 may be connected to a plurality of data lines DL, provided in the light emitting display panel 100, via the pad part. The data driver 300 may convert the pixel data Pdata into an analog data voltage by using the data control signal DCS and a plurality of reference gamma voltages provided from the timing controller 400 and may provide a converted data voltage to a corresponding data line DL.

The gate driver 200 may generate an initialization control signal, a scan control signal, and an emission control signal respectively corresponding to the initialization period, the sampling period, and the emission period of each of a plurality of pixels P on the basis of the gate control signal GCS provided from the timing controller 400 and may provide the initialization control signal, the scan control signal, and the emission control signal to the plurality of pixels P.

The gate driver 200 according to an embodiment may generate emission control signals which have the same period and a sequentially-shifted phase and may supply the emission control signals to a plurality of emission control lines ECL.

The gate driver 200 according to an embodiment may be provided in a left non-display area and/or a right non-display area of a substrate through a process of manufacturing a thin film transistor (TFT) of each of the pixels P.

For example, the gate driver 200 may be provided in the left non-display area of the substrate and may supply the emission control signal to one end of each of the emission control lines ECL on the basis of a single feeding method.

As another example, the gate driver 200 may be provided in each of the left non-display area and the right non-display area of the substrate and may supply the emission control signal to both ends of each of the emission control lines ECL on the basis of a double feeding method.

Figure 2:
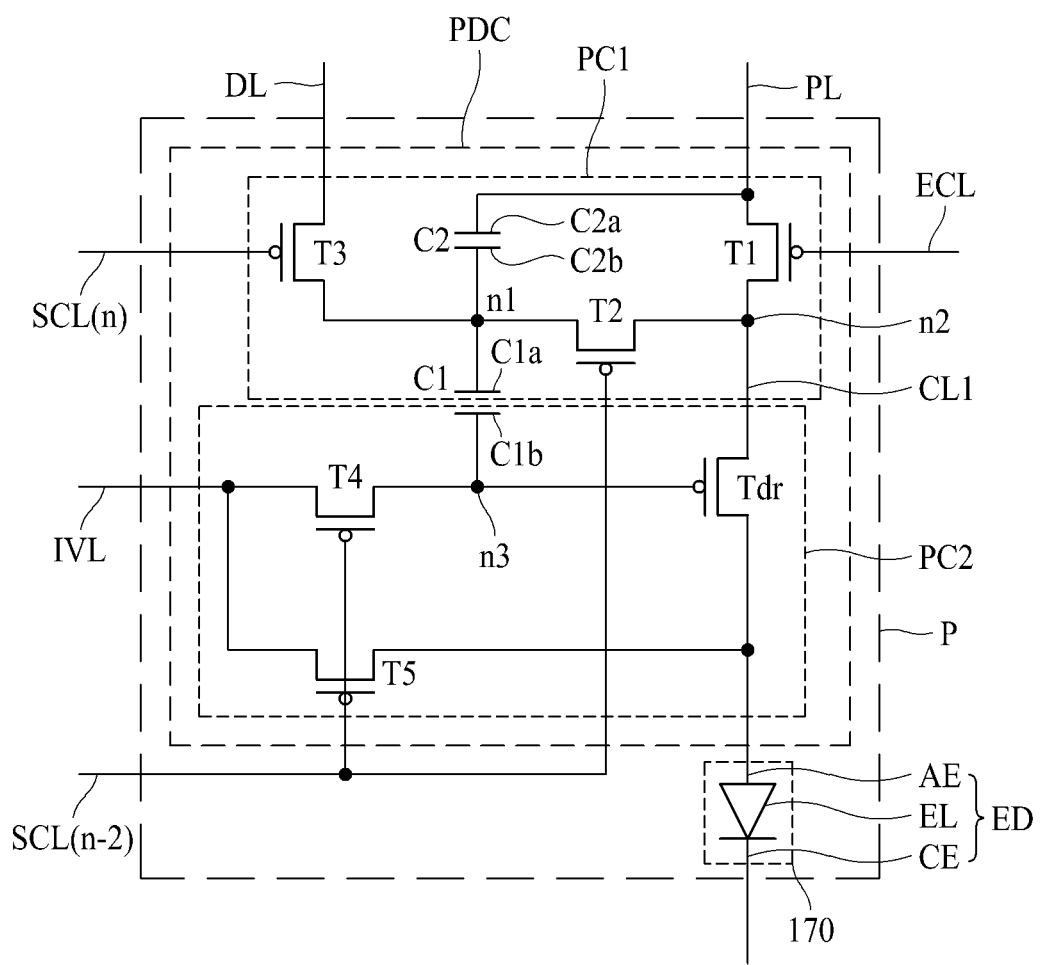
FIG. 2 is a circuit diagram of an embodiment of a pixel applied to a light emitting display panel according to the present disclosure.
Figure 3:
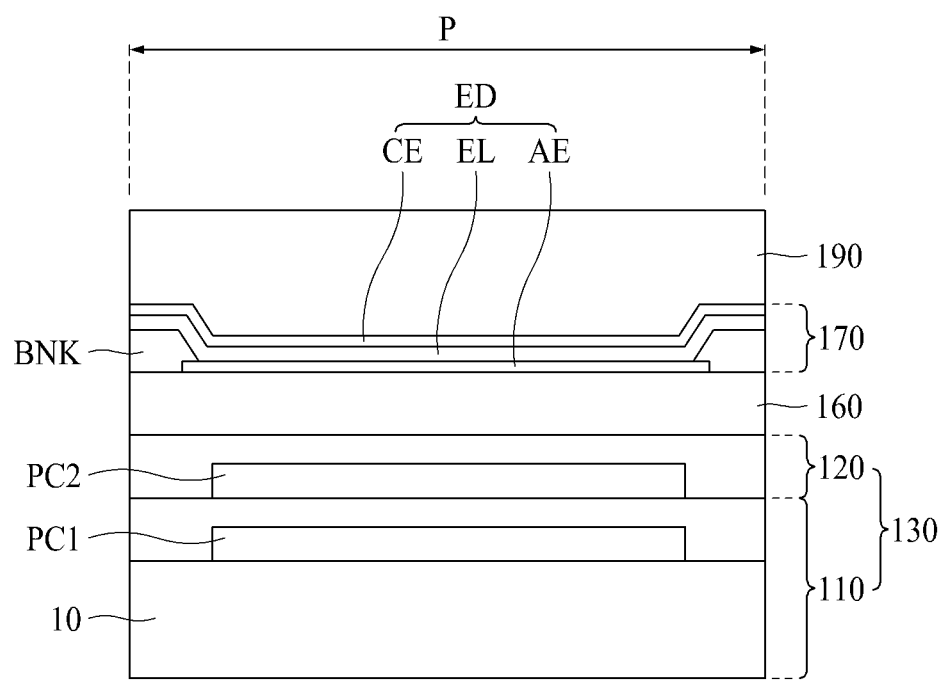
FIG. 3 is a cross-sectional view illustrating a layer structure of a pixel illustrated in FIG. 2.
Figure 4:
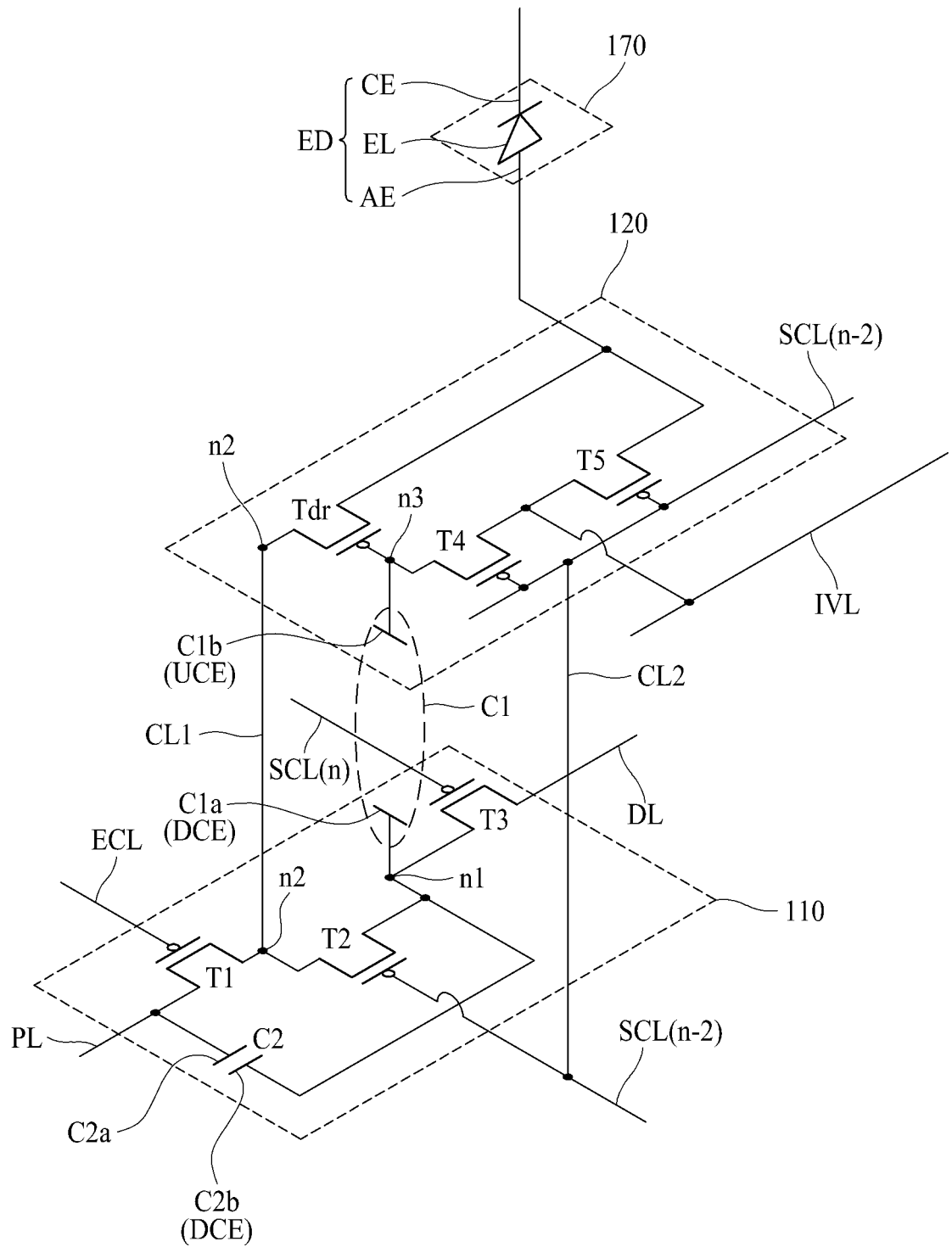
FIG. 4 is a diagram illustrating a circuit configuration of each layer illustrated in FIG. 3.

FIG. 2 is a circuit diagram of an embodiment of a pixel applied to a light emitting display panel according to the present disclosure, FIG. 3 is a cross-sectional view illustrating a layer structure of a pixel illustrated in FIG. 2, and FIG. 4 is a diagram illustrating a circuit configuration of each layer illustrated in FIG. 3.

As illustrated in FIGS. 2 to 4, a pixel P applied to the light emitting display panel according to the present disclosure may include a pixel driving circuit layer 130 including a pixel driving circuit PDC, a light emitting device layer 170 including a light emitting device ED electrically connected to the pixel driving circuit PDC, and a planarization layer 160 provided between the pixel driving circuit layer 130 and the light emitting device layer 170.

The pixel driving circuit layer 130 may include a first pixel circuit layer 110 including a first pixel circuit PC1 and a second pixel circuit layer 120 including a second pixel circuit PC2.

First, the first pixel circuit layer 110 according to an embodiment may include a substrate 10, a first pixel circuit PC1, an emission control line ECL for transferring an emission control signal to the first pixel circuit PC1, a data line DL for transferring a data voltage to the first pixel circuit PC1, and an $n^{th}$ scan control line SCL(n) for transferring an $n^{th}$ scan control signal to the first pixel circuit PC1.

The emission control line ECL may be disposed in a pixel P in parallel with a first direction X.

The pixel driving voltage line PL may be disposed in the pixel P in parallel with a second direction Y.

The data line DL may be disposed at one edge of the pixel P in parallel with the second direction Y. The data line DL according to an embodiment may be disposed at one edge of the pixel P to overlap with or not to overlap with the pixel driving voltage line PL disposed in the first pixel circuit layer 110 one-dimensionally. For example, the data line DL may be disposed at the one edge of the pixel P to overlap with the pixel driving voltage line PL disposed in the first pixel circuit layer 110.

The $n^{th}$ scan control line SCL(n) may be disposed in the pixel P and may be apart from and parallel to the emission control line ECL. The $n^{th}$ scan control line SCL(n) according to an embodiment may be disposed in the pixel P to overlap with or not to overlap with an emission control line ECL disposed in the first pixel circuit layer 110 one-dimensionally.

The first pixel circuit PC1 may store a data voltage supplied through the data line DL and a threshold voltage of the driving transistor Tdr included in the second pixel circuit PC2 and may control an emission timing of the light emitting device ED.

The first pixel circuit PC1 according to an embodiment may include a first capacitor C1 which includes a first terminal C1a, a first transistor T1 which includes a gate connected to the emission control line ECL and a first terminal connected to the pixel driving voltage line PL, a second transistor T2 which includes a gate connected to the $n-2^{th}$ scan control line SCL(n-2) and a first terminal connected to the first terminal C1a of the first capacitor C1, a third transistor T3 which includes a gate connected to the $n^{th}$ scan control line SCLn, a first terminal connected to the data line DL, and a second terminal connected to the first terminal of the second transistor T2, and a second capacitor C2 which includes a first terminal C2a connected to the first terminal of the first transistor T1 and a second terminal C2b connected to the first terminal C1a of the first capacitor C1.

In the following description, the first terminal C2a of the second capacitor C2 may be referred to as a first electrode C2a, the second terminal C2b of the second capacitor C2 may be referred to as a second electrode C2b, the first terminal C1a of the first capacitor C1 may be referred to as a third electrode C1a, and the second terminal C1b of the first capacitor C1 may be referred to as a fourth electrode C1b.

First, the first transistor T1 may be turned on based on an emission control signal supplied through the emission control line ECL, and when the first transistor T1 is turned on, a current may flow through the driving transistor Tdr and the light emitting device ED and thus the light emitting device ED may emit light.

The first transistor T1 according to an embodiment may include a first gate electrode connected to the emission control line ECL, a second terminal connected to a first terminal of the driving transistor Tdr, and a first terminal connected to the second capacitor C2. In the following description, in a case where gates of first to fifth transistor T1 to T5 should be differentiated from one another, the gates may be referred to as first to fifth gate electrodes. Also, a gate of the driving transistor Tdr may be referred to as a driving gate electrode.

The first terminal of the driving transistor Tdr may be a source electrode, and the second terminal thereof may be a drain electrode. The first transistor T1 may be turned on based on the emission control signal supplied through the emission control line ECL, and thus, a current may flow in the first transistor T1, the driving transistor Tdr, and the light emitting device ED.

Subsequently, the second transistor T2 may be turned on or off based on a second scan control signal supplied through the $n-2^{th}$ scan control line SCL(n-2) among the plurality of scan control lines SCL. When the second transistor T2 is turned on, a data voltage or a sensing voltage supplied through the data line DL may be charged into at least one of the first capacitor C1 and the second capacitor C2.

The second transistor T2 according to an embodiment may include a second gate electrode connected to the $n-2^{th}$ scan control line SCL(n-2), a first terminal connected to the second terminal of the third transistor T3, and a second terminal connected to the second terminal of the first transistor T1.

Subsequently, the third transistor T3 may be turned on or off based on an $n^{th}$ scan control signal supplied through the $n^{th}$ scan control line SCL(n) among the plurality of scan control lines SCL. When the third transistor T3 is turned on, a data voltage or a sensing voltage supplied through the data line DL may be charged into at least one of the first capacitor C1 and the second capacitor C2.

The third transistor T3 according to an embodiment may include a third gate electrode connected to the $n^{th}$ scan control line SCL(n), a first terminal connected to the data line DL, and a second terminal connected to the first terminal of the second transistor T2.

Each of the first to third transistors T1 to T3 may include a semiconductor layer including an amorphous silicon material, a polysilicon material, or an oxide semiconductor material and may be a P-type TFT including a semiconductor layer doped with P-type impurities, but is not limited thereto and may be an N-type TFT including a semiconductor layer doped with N-type impurities. That is, in FIG. 2, a pixel driving circuit PDC including a plurality of P-type TFTs is illustrated, but the pixel driving circuit PDC may include a plurality of N-type TFTs. That is, in FIG. 2, the pixel driving circuit PDC including a plurality of P-type TFTs is illustrated, and the pixel driving circuit PDC may be configured with a plurality of N-type TFTs.

The polysilicon material may be good in reliability with respect to a strong bias stress and may have high electron mobility. Therefore, each of the first to third transistors T1 to T3 according to an embodiment may include a P-type TFT including a semiconductor layer including a polysilicon material doped with P-type impurities.

Subsequently, the first capacitor C1 may store an initialization voltage supplied through an initialization voltage line IVL. Also, the first capacitor C1 may store a voltage compensating for a characteristic variation of the driving transistor Tdr along with the second capacitor C2.

The third electrode C1a of the first capacitor C1 according to an embodiment may be connected to the second terminal of the third transistor T3, the second electrode C2b of the second capacitor C2, and the first terminal of the second transistor T2.

The fourth electrode C1b of the first capacitor C1 may be connected to the second terminal of the fourth transistor T4 and the gate of the driving transistor Tdr.

In this case, the third electrode C1a of the first capacitor C1 may be included in the first pixel circuit layer 110, and the fourth electrode C1b of the first capacitor C1 may be included in the second pixel circuit layer 120.

That is, in the present disclosure, the first capacitor C1 may generate a capacitance by using the third electrode C1a included in the first pixel circuit layer 110 and the fourth electrode C1b included in the second pixel circuit layer 120. Therefore, the first pixel circuit layer 110 or the second pixel circuit layer 120 may not need an additional area, for the first capacitor C1.

To provide an additional description, a specific gravity of an area of the first capacitor C1 may be large in the pixel driving circuit PDC. Therefore, when the first capacitor C1 should be included in the first pixel circuit layer 110 or the second pixel circuit layer 120, a wide area for the first capacitor C1 should be secured, and thus, an area of the first pixel circuit layer 110 or the second pixel circuit layer 120 should be enlarged for the pixel driving circuit PDC.

However, in the present disclosure, as described above, the first capacitor C1 may be formed by the third electrode C1a included in the first pixel circuit layer 110 and the fourth electrode C1b included in the second pixel circuit layer 120. Therefore, the first pixel circuit layer 110 or the second pixel circuit layer 120 may not need an additional area, for the first capacitor C1, and thus, an area of the first pixel circuit layer 110 or the second pixel circuit layer 120 may be reduced.

Moreover, because the fourth electrode C1b included in the second pixel circuit layer 120 may be used as a blocking layer for blocking an electric field or light, a parasitic capacitance may be reduced, and a defect such as two-dimensional (2D) crosstalk may be prevented.

Finally, the second capacitor C2 may store a difference voltage between the driving gate electrode and the source electrode of the driving transistor Tdr. Also, the second capacitor C2 may store a voltage for compensating for a characteristic variation of the driving transistor Tdr along with the first capacitor C1. That is, by using the first and second capacitors C1 and C2, a data voltage supplied through the data line DL, an initialization voltage supplied through the initialization voltage line IVL, and a threshold voltage of the driving transistor Tdr may be stored in the first pixel circuit PC1 and the second pixel circuit PC2.

Therefore, the light emitting device ED may emit light having brightness corresponding to the data voltage, regardless of a variation of the threshold voltage of the driving transistor Tdr.

The first electrode C2a of the second capacitor C2 according to an embodiment may be connected to the first terminal of the first transistor T1, and the second electrode C2b of the second capacitor C2 may be connected to the second terminal of the third transistor T3, the third electrode C1a of the first capacitor C1, and the first terminal of the second transistor T2.

The second terminal of the first transistor T1 included in the first pixel circuit layer 110 may be electrically connected to, through a connection line CL1, the first terminal of the driving transistor Tdr included in the second pixel circuit layer 120.

The n-$2^{th}$ scan control line SCL(n-2) included in the first pixel circuit layer 110 may be connected to, through a scan connection line CL2, the n-$2^{th}$ scan control line SCL(n-2) included in the second pixel circuit layer 120. In this case, the scan connection line CL2 may be provided in the display area AA, and moreover, may be provided in the non-display area IA. Also, at least one scan connection line CL2 may be provided in only the non-display area IA, or at least one scan connection line CL2 may be provided in only the display area AA. Alternatively, at least two scan connection lines CL2 may be provided in the display area AA and the non-display area IA.

Second, the second pixel circuit layer 120 may be disposed on a top surface (or a surface) of the first pixel circuit layer 110.

The second pixel circuit layer 120 according to an embodiment may include a second pixel circuit PC2, an initialization voltage line IVL for transferring the initialization voltage to the second pixel circuit PC2, and the n-$2^{th}$ scan control line SCL(n-2) for transferring an n-$2^{th}$ scan control signal to the second pixel circuit PC2.

The initialization voltage line IVL may be disposed in the pixel P in parallel with the data line DL. The initialization voltage supplied through the initialization voltage line IVL may initialize the first capacitor C1, the second capacitor C2, and the light emitting device ED.

The n-$2^{th}$ scan control line SCL(n-2) may be disposed in the pixel P and may be apart from and parallel to the emission control line ECL. The n-$2^{th}$ scan control line SCL(n-2) according to an embodiment may be disposed in the pixel P to overlap with or not to overlap with an emission control line ECL disposed in the first pixel circuit layer 110 one-dimensionally.

Moreover, the n-$2^{th}$ scan control line SCL(n-2) may be disposed in the pixel P to overlap with or not to overlap with the n-$2^{th}$ scan control line SCL(n-2) disposed in the first pixel circuit layer 110 one-dimensionally.

The second pixel circuit PC2 may supply the light emitting device ED with a current corresponding to the data voltage supplied through the data line DL.

The second pixel circuit PC2 according to an embodiment may include a driving transistor Tdr which includes a driving gate electrode connected to the fourth electrode C1b, a first terminal connected to the second terminal of the first transistor T1, and a second terminal connected to the light emitting device ED, a fourth transistor T4 which includes a fourth gate connected to the n-$2^{th}$ scan control line SCL(n-2), a first terminal connected to the initialization voltage line IVL, and a second terminal connected to the fourth electrode C1b, and a fifth transistor T5 which includes a fifth gate connected to the n-$2^{th}$ scan control line SCL(n-2), a first terminal connected to the initialization voltage line IVL, and a second terminal connected to the second terminal of the driving transistor Tdr.

First, the driving transistor Tdr may transfer a current, corresponding to a gate-source voltage based on a data voltage supplied from the first pixel circuit PC1, to the light emitting device ED.

The driving transistor Tdr according to an embodiment may include a first terminal connected to the second terminal of the first transistor T1, a second terminal connected to the light emitting device ED, and a driving gate electrode connected to the fourth electrode C1b of the first capacitor C1.

The first terminal of the driving transistor Tdr may be a source electrode, and the second terminal thereof may be a drain electrode. The driving transistor Tdr may be turned on based on a gate-source voltage, and thus, a current corresponding to the gate-source voltage based on the data voltage may flow in the first transistor T1, the driving transistor Tdr, and the light emitting device ED.

Subsequently, the fourth transistor T4 may be turned on or off based on the $n-2^{th}$ scan control signal supplied through the $n-2^{th}$ scan control line SCL(n-2). When the fourth transistor T4 is turned on, the initialization voltage supplied through the initialization voltage line IVL may be charged into at least one of the first capacitor C1 and the second capacitor C2.

The fourth transistor T4 according to an embodiment may include a fourth gate electrode connected to the $n-2^{th}$ scan control line SCL(n-2), a first terminal connected to the initialization voltage line IVL, and a second terminal connected to the driving gate electrode of the driving transistor Tdr. The second terminal of the fourth transistor T4 may be connected to the fourth electrode C1b of the first capacitor C1. That is, the fourth electrode C1b of the first capacitor C1 may be connected to the second terminal of the fourth transistor T4 and the driving gate electrode of the driving transistor Tdr.

Subsequently, the fifth transistor T5 may be turned on or off based on the $n-2^{th}$ scan control signal supplied through the $n-2^{th}$ scan control line SCL(n-2). When the fifth transistor T5 is turned on, the initialization voltage supplied through the initialization voltage line IVL may be supplied to the light emitting device ED through the fifth transistor T5. Therefore, the light emitting device ED may be initialized to the initialization voltage.

The fifth transistor T5 according to an embodiment may include a fifth gate electrode connected to the $n-2^{th}$ scan control line SCL(n-2), a first terminal connected to the initialization voltage line IVL, and a second terminal connected to the second terminal of the driving transistor Tdr. The second terminal of the fifth transistor T5 may be connected to the second terminal of the driving transistor Tdr and the light emitting device ED.

Each of the driving transistor Tdr, the fourth transistor T4, and the fifth transistor T5 may include a semiconductor layer including an amorphous silicon material, a polysilicon material, or an oxide semiconductor material and may be a P-type TFT including a semiconductor layer doped with P-type impurities, but is not limited thereto and may use may be an N-type TFT including a semiconductor layer doped with N-type impurities. That is, in FIG. 2, a pixel driving circuit PDC including a plurality of P-type TFTs is illustrated, but the pixel driving circuit PDC may include a plurality of N-type TFTs. That is, in FIG. 2, the pixel driving circuit PDC including a plurality of P-type TFTs is illustrated, and the pixel driving circuit PDC may be configured with a plurality of N-type TFTs.

The polysilicon material may be good in reliability with respect to a strong bias stress and may have high electron mobility. Therefore, each of the driving transistor Tdr, the fourth transistor T4, and the fifth transistor T5 according to an embodiment may include a P-type TFT including a semiconductor layer including a polysilicon material doped with P-type impurities.

Finally, the first capacitor C1 may store the initialization voltage supplied through the initialization voltage line IVL as described above. Also, the first capacitor C1 may store a voltage for compensating for a characteristic variation of the driving transistor Tdr along with the second capacitor C2.

The third electrode C1a of the first capacitor C1 according to an embodiment may be connected to the second terminal of the third transistor T3, the second electrode C2b of the second capacitor C2, and the first terminal of the second transistor T2.

The fourth electrode C1b of the first capacitor C1 may be connected to the second terminal of the fourth transistor T4 and the driving gate electrode of the driving transistor Tdr.

In this case, the third electrode C1a of the first capacitor C1 may be provided in the first pixel circuit layer 110, and the fourth electrode C1b of the first capacitor C1 may be provided in the second pixel circuit layer 120.

That is, in the present disclosure, the first capacitor C1 may generate a capacitance by using the third electrode C1a included in the first pixel circuit layer 110 and the fourth electrode C1b included in the second pixel circuit layer 120. Therefore, the first pixel circuit layer 110 or the second pixel circuit layer 120 may not need an additional area, for the first capacitor C1.

The light emitting device layer 170 may include a light emitting device ED, which is electrically connected to the second pixel circuit PC2 and emits light on the basis of a current supplied from the second pixel circuit PC2, and a bank pattern BNK.

The light emitting device ED according to an embodiment may include a pixel driving electrode AE (referred to as an anode electrode) connected to the pixel driving circuit PDC, a light emitting layer EL formed on the pixel driving electrode AE, and a common electrode layer CE (referred to as a cathode electrode) electrically connected to the light emitting layer EL.

The pixel driving electrode AE may be disposed in an opening area of the pixel P and may be electrically connected to the second terminal of the driving transistor Tdr included in the second pixel circuit PC2.

The pixel driving electrode AE according to an embodiment may include a metal material which is high in reflectance. For example, the pixel driving electrode AE may be formed in a multi-layer structure such as a stacked structure (titanium/aluminum/titanium (Ti/Al/Ti)) of aluminum (Al) and titanium (Ti), a stacked structure (indium tin oxide/aluminum/indium tin oxide (ITO/Al/ITO)) of Al and indium tin oxide (ITO), an APC (silver/palladium/copper (Ag/Pd/Cu)) alloy, or a stacked structure (ITO/APC/ITO) of an APC alloy and ITO, or may include a single-layer structure including one material or an alloy material of two or more materials selected from among Ag, Al, molybdenum (Mo), gold (Au), magnesium (Mg), calcium (Ca), and barium (Ba).

An edge of the pixel driving electrode AE may be at least partially covered by the bank pattern BNK. The bank pattern BNK may be disposed in a pixel area other than an opening area of the pixel P and may at least partially cover an edge of the pixel driving electrode AE. Accordingly, the opening area of the pixel P may be defined.

The bank pattern BNK according to an embodiment may define the opening area of the pixel P as a pentile structure or a stripe structure.

The light emitting layer EL according to an embodiment may be formed in the whole display area AA of the substrate 10 to at least partially cover the pixel driving electrode AE and the bank pattern BNK.

The light emitting layer EL according to an embodiment may include two or more light emitting parts for emitting white light. For example, the light emitting layer EL according to an embodiment may include a first light emitting part and a second light emitting part, for emitting white light on the basis of a combination of first light and second light. Here, the first light emitting part may emit the first light and may include one of a blue light emitting part, a green light emitting part, a red light emitting part, a yellow light emitting part, and a yellowish green light emitting part. The second light emitting part may include a light emitting part emitting the second light having a complementary color relationship with the first light among a blue light emitting part, a green light emitting part, a red light emitting part, a yellow light emitting part, and a yellowish green light emitting part.

According to another embodiment, the light emitting layer EL may include one of a blue light emitting part, a green light emitting part, and a red light emitting part, for emitting colored light corresponding to a color set in the pixel P. For example, the light emitting layer EL according to another embodiment may include one of an organic light emitting layer, an inorganic light emitting layer, and a quantum dot light emitting layer, or may include a stacked or combination structure of an organic light emitting layer (or an inorganic light emitting layer) and a quantum dot light emitting layer.

Additionally, the light emitting device ED according to an embodiment may further include a function layer for enhancing the emission efficiency and/or lifetime of the light emitting layer EL.

The common electrode layer CE may be formed to be electrically connected to the light emitting layer EL. The common electrode layer CE may be formed in the whole display area AA of the substrate 10 and may be connected to the light emitting layer EL provided in each pixel area PA in common.

The common electrode layer CE according to an embodiment may include a transparent conductive material, transparent metal, or a semi-transmissive conductive material, which may transmit light. When the common electrode layer CE includes the semi-transmissive conductive material, the emission efficiency of light emitted from the light emitting device ED may increase based on a micro-cavity. The semi-transmissive conductive material according to an embodiment may include Mg, Ag, or an alloy of Mg and Ag. Additionally, a capping layer for adjusting a refractive index of the light emitted from the light emitting device ED to enhance the emission efficiency of the light may be further formed on the common electrode layer CE.

According to another embodiment, the light emitting layer EL may include a micro light emitting diode device implemented as an integrated circuit (IC) type. The micro light emitting diode device may include a first terminal electrically connected to the pixel driving electrode AE and a second terminal electrically connected to the common electrode layer CE.

The pixel P according to an embodiment may further include a planarization layer 160 at least partially covering the second pixel circuit layer 120 and an encapsulation layer 190 at least partially covering the light emitting device layer 170.

The planarization layer 160 may be disposed on the substrate 10 to at least partially cover the second pixel circuit layer 120 and may provide a flat surface on the second pixel circuit layer 120.

The light emitting device layer 170 may be disposed on the planarization layer 160. In this case, the pixel driving electrode AE of the light emitting device layer 170 may be electrically connected to the second terminal of the driving transistor Tdr of the second pixel circuit PC2 through an electrode contact hole provided in the planarization layer 160.

The encapsulation layer 190 may be formed on the substrate 10 to at least partially surround the light emitting device layer 170. The encapsulation layer 190 may prevent oxygen or water from penetrating into the light emitting device ED.

The encapsulation layer 190 according to an embodiment may include at least one inorganic layer for preventing or minimizing the penetration of oxygen or water and an organic layer which covers particles occurring in a manufacturing process. For example, the encapsulation layer 190 may include a first inorganic layer, an organic layer on the first inorganic layer, and a second inorganic layer on the organic layer.

Additionally, the pixel P according to an embodiment of the present disclosure may further include a black matrix overlapping with the bank pattern BNK and a wavelength conversion layer disposed in the opening area.

The black matrix may be disposed on the encapsulation layer 190 to overlap with the bank pattern BNK.

The wavelength conversion layer according to an embodiment may include a color filter which is disposed on the encapsulation layer 190 overlapping with the opening area of the pixel P to transmit only a color wavelength, set in the pixel P, of white light incident from the light emitting device ED. For example, the wavelength conversion layer may transmit only a wavelength of red, green, or blue. When the light emitting layer EL of the light emitting device ED includes a light emitting layer emitting red light, green light, and blue light, the wavelength conversion layer may be omitted.

The pixel P according to an embodiment of the present disclosure may further include a barrier film and a light path control layer.

The barrier film may be attached on the encapsulation layer 190 by using an adhesive layer. The barrier film may primarily prevent the penetration of oxygen or water and may include a material which is low in water vapor transmission rate.

The light path control layer may control a path of incident light.

The light path control layer according to an embodiment may include a plurality of refractive layers. The plurality of refractive layers may have different refractive indexes. The light path control layer may have a structure where a high refractive layer and a low refractive layer are alternately stacked. The light path control layer according to an embodiment may change a path of incident light to minimize a color shift phenomenon caused by a viewing angle.

According to another embodiment, the light path control layer may be a polarization layer. The polarization layer may change external light, reflected by TFTs and/or lines provided in the pixel P, to circularly-polarized light, thereby enhancing visibility and a contrast ratio.

An operation of a pixel according to an embodiment of the present disclosure will be described below.

The pixel P according to an embodiment of the present disclosure may operate in an initialization period, a routing period, and an emission period. For example, one frame of a light emitting display apparatus to which a light emitting display panel according to an embodiment of the present disclosure is applied may include an initialization period for initializing the driving gate electrode of the driving transistor Tdr, a routing period for storing a sampling voltage and a data voltage each corresponding to a characteristic value (for example, a threshold voltage) of the driving transistor Tdr, and an emission period for allowing the light emitting device ED to emit light with a current corresponding to the data voltage.

In the initialization/sampling period, a low voltage may be supplied to the n–2$^{th}$ scan control line SCL(n−2), and thus, the second transistor T2, the fourth transistor T4, and the fifth transistor T5 may be turned on. In this case, the driving transistor Tdr may operate as a diode, and thus, a voltage of a node (e.g., a first node n1) between the second terminal of the third transistor T3 and the first terminal of the second transistor T2 may be a sum voltage which is a sum of an initialization voltage Vinit and a threshold voltage V$^{th}$ of the driving transistor Tdr. Accordingly, the threshold voltage V$^{th}$ may be stored in the capacitor C1.

In the routing period, a low voltage may be supplied to the n$^{th}$ scan control line SCL(n), and thus, the third transistor T3 may be turned on. In this case, the voltage of the first node n1 may be a data voltage Vdata supplied through the data line DL. Also, a voltage of a node (e.g., a third node n3) connected to the driving gate electrode of the driving transistor Tdr may be a difference voltage between the data voltage Vdata and the threshold voltage Vth.

In the emission period, a low voltage may be supplied to the emission control line ECL, and thus, the first transistor T1 may be turned on. In this case, a current supplied to the light emitting device ED may be proportional to the square of a difference voltage between a gate-source voltage Vgs of the driving transistor Tdr and the threshold voltage Vth. In the emission period, a gate voltage (e.g., the voltage of the third node n3) of the driving transistor Tdr may be a difference voltage (=Vdata−Vth) between the data voltage Vdata and the threshold voltage Vth, and a source voltage of the driving transistor Tdr may be a pixel driving voltage Vdd supplied through the pixel driving voltage line PL. Therefore, a current supplied to the light emitting device ED may be proportional to the square of a difference voltage (=Vdd−Vdata) between the data voltage Vdata and the pixel driving voltage Vdd.

That is, according to the present disclosure, a current supplied to the light emitting device ED may be irrelevant to the threshold voltage V$^{th}$ of the driving transistor Tdr and may be determined by only the pixel driving voltage Vdd and the data voltage Vdata.

Therefore, according to the present disclosure, even when the driving transistor Tdr is degraded to cause a variation of the threshold voltage V$^{th}$ of the driving transistor Tdr, a current supplied to the light emitting device ED may not be affected by the variation of the threshold voltage Vth. Accordingly, according to the present disclosure, the current may be controlled by only the data voltage Vdata regardless of the amount of variation of the threshold voltage V$^{th}$ of the driving transistor Tdr.

Figure 5:
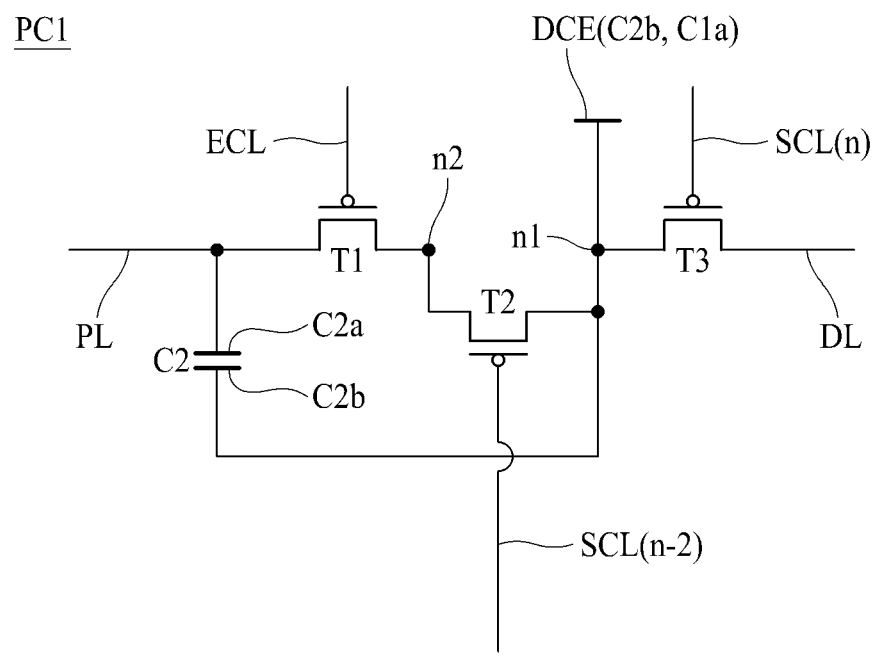
FIG. 5 is a diagram illustrating a first pixel circuit illustrated in FIG. 2.
Figure 6:
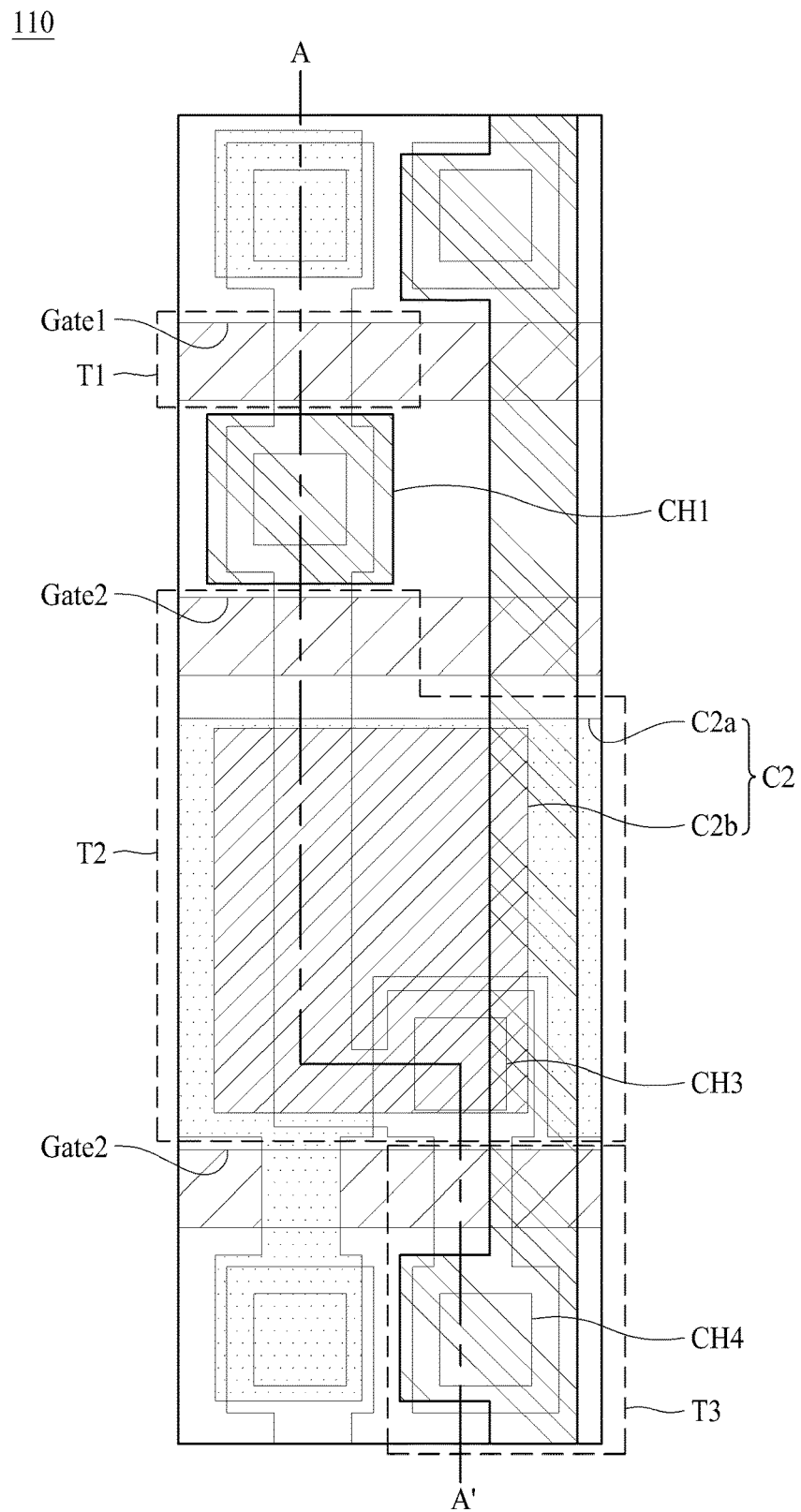
FIG. 6 is a diagram illustrating a layout of a first pixel circuit layer including the first pixel circuit illustrated in FIG. 5.
Figure 7:
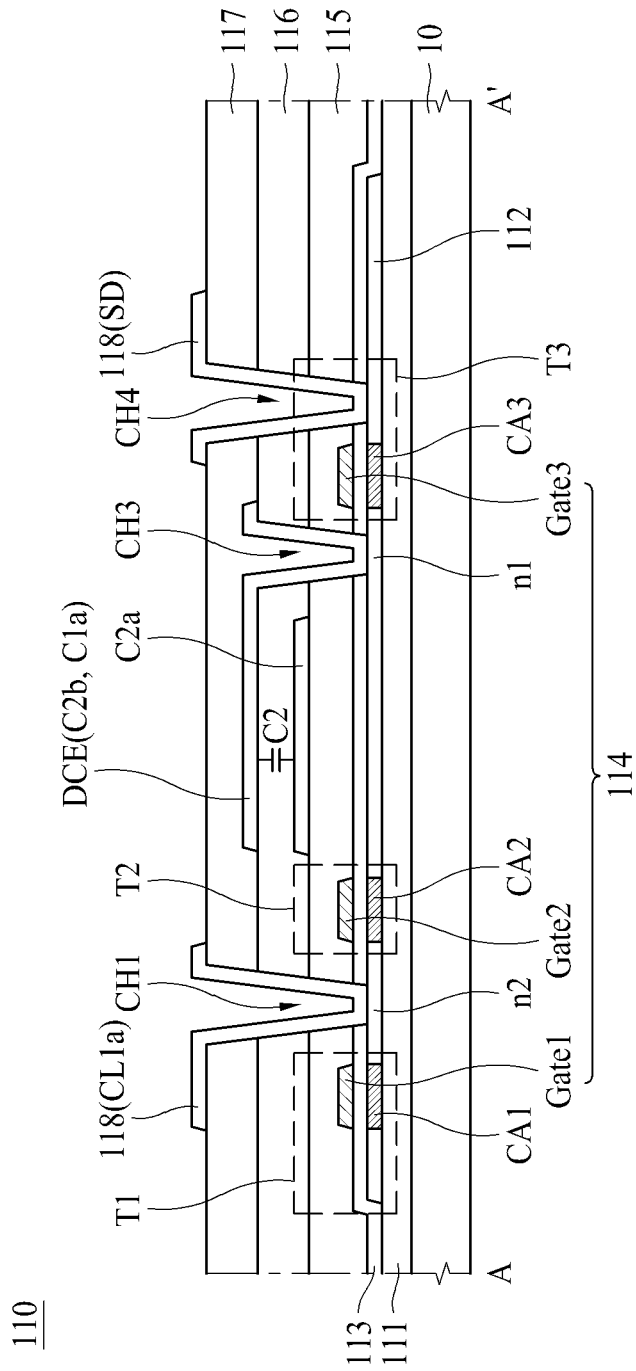
FIG. 7 is a cross-sectional view taken along line A-A' illustrated in FIG. 6.

FIG. 5 is a diagram illustrating a first pixel circuit illustrated in FIG. 2, FIG. 6 is a diagram illustrating a layout of a first pixel circuit layer including the first pixel circuit illustrated in FIG. 5, and FIG. 7 is a cross-sectional view taken along line A-A' illustrated in FIG. 6. That is, FIG. 5 illustrates a first pixel circuit included in one pixel, FIG. 6 illustrates a horizontal structure of the first pixel circuit layer in one pixel, and FIG. 7 illustrates a vertical structure of the first pixel circuit layer in one pixel.

In a pixel P of a light emitting display panel 100 according to an embodiment of the present disclosure, as illustrated in FIGS. 5 to 7, the first pixel circuit layer 110 may include a substrate 10, a first buffer layer 111, a first semiconductor layer 112 formed in a region, corresponding to the first to third transistors T1 to T3, of the substrate 10, a first gate insulation layer 113 at least partially covering the first semiconductor layer 112, a first gate electrode layer 114 formed in an island shape in a region, corresponding to the first to third transistors T1 to T3, of the first gate insulation layer 113, a first passivation layer 115 at least partially covering the first gate electrode layer 114, a first electrode C2a formed in an island shape on the first passivation layer 115, a second passivation layer 116 at least partially covering the first electrode C2a, a first layer electrode DCE formed in an island shape on the second passivation layer 116, a third passivation layer (hereinafter referred to as a lower end passivation layer) 117 at least partially covering the first layer electrode DCE, and a first connection part CL1a formed in an island shape on the lower end passivation layer 117 and connected to the second pixel circuit layer 120. The first connection part CL1a may be included in a first connection layer 118. The first layer electrode DCE may perform a function of the third electrode C1a configuring the first capacitor C1 and a function of the second electrode C2b configuring the second capacitor C2. That is, in the present closure, the first layer electrode DCE may be the second electrode C2b, or may be the third electrode C1a.

First, the substrate 10 may include a display area AA and a non-display area IA, and a plurality of pixels P may be provided in the display area AA. FIGS. 5 to 7 illustrate one pixel.

The first buffer layer 111 may be provided on the substrate 10, for preventing the penetration of water or increasing an adhesive force to the first semiconductor layer 112.

The first buffer layer 111 may include an organic material or an inorganic material and may be formed of at least two layers.

The first semiconductor layer 112 may be provided in an area where the first to third transistors T1 to T3 are disposed. The first semiconductor layer 112 may include a polysilicon material.

The first semiconductor layer 112 according to an embodiment may include a first channel area CAL a second channel area CA2, and a third channel area CA3, which are apart from one another, and moreover, may include a plurality of high-concentration doping areas respectively provided in both ends of the first to third channel areas CA1 to CA3.

The first to third channel areas CA1 to CA3 may be respectively used as semiconductor layers of the first to third transistors T1 to T3.

The high-concentration doping areas may include metal properties and may be used as the first terminal or the second terminal of each of the first to third transistors T1 to T3.

For example, in FIG. 7, a high-concentration doping area provided to the left of the first channel area CA1 may be the first terminal of the first transistor T1, and a high-concentration doping area provided to the right of the first channel area CA1 may be the second terminal of the first transistor T1.

Moreover, in FIG. 7, a high-concentration doping area provided to the left of the second channel area CA2 may be the second terminal of the second transistor T2, and a high-concentration doping area provided to the right of the second channel area CA2 may be the first terminal of the second transistor T2.

Moreover, in FIG. 7, a high-concentration doping area provided to the left of the third channel area CA3 may be the second terminal of the third transistor T3, and a high-concentration doping area provided to the right of the third channel area CA3 may be the first terminal of the third transistor T3.

That is, as described above with reference to FIG. 2, the first terminal of the first transistor T1 may be connected to the pixel driving voltage line PL, the second terminal of the first transistor T1 may be connected to the second terminal of the second transistor T2, and the first terminal of the second transistor T2 may be connected to the second terminal of the third transistor T3.

Particularly, as illustrated in FIGS. 2, 5, and 7, the second terminal of the first transistor T1 may be connected to the second terminal of the second transistor T2, and a portion connecting the second terminal of the first transistor T1 to the second terminal of the second transistor T2 may be referred to as a second node n2.

The second node n2 may be connected to the first connection part CL1a for connecting the second node n2 to the first terminal of the driving transistor Tdr included in the second pixel circuit layer 120.

Subsequently, the first gate insulation layer 113 may be formed all over the substrate 10 to at least partially cover the first semiconductor layer 112. The first gate insulation layer 113 according to an embodiment may include silicon oxide (SiOx), silicon nitride (SiNx), or a multilayer thereof.

Subsequently, the first gate electrode layer 114 may be provided in an independent pattern shape (for example, an island shape) on the first gate insulation layer 113. The first gate electrode layer 114 may include a first gate electrode Gate1 provided in an area overlapping with the first channel area CA1, a second gate electrode Gate2 provided in an area overlapping with the second channel area CA2, and a third gate electrode Gate3 provided in an area overlapping with the third channel area CA3.

The first gate electrode Gate1, the high-concentration doping area disposed to the left of the first channel area CA1, and the high-concentration doping area disposed to the right of the first channel area CA1 may configure the first transistor T1. The second gate electrode Gate2, the high-concentration doping area disposed to the left of the second channel area CA2, and the high-concentration doping area disposed to the right of the second channel area CA2 may configure the second transistor T2. The third gate electrode Gate3, the high-concentration doping area disposed to the left of the third channel area CA3, and the high-concentration doping area disposed to the right of the third channel area CA3 may configure the third transistor T3.

The first gate electrode layer 114 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

Subsequently, the first passivation layer 115 may be formed all over the substrate 10 to at least partially cover the first gate electrode layer 114. The first passivation layer 115 may include SiOx, SiNx, or a multilayer thereof.

Subsequently, the first electrode C2a of the second capacitor C2 may be provided in a pattern shape (for example, an island shape) on the first passivation layer 115. The first electrode C2a may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

Subsequently, the second passivation layer 116 may be formed all over the substrate 10 to at least partially cover the first electrode C2a. The second passivation layer 116 may include SiOx, SiNx, or a multilayer thereof.

Subsequently, the first layer electrode DCE may be provided in a pattern shape (for example, an island shape) on the second passivation layer 116. The first layer electrode DCE may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

The first layer electrode DCE may be connected to a high-concentration doping area, provided between the second channel area CA2 and the second third channel area CA3, of the first semiconductor layer 112 through a third contact hole CH3 provided in the first gate insulation layer 113, the first passivation layer 115, and the second passivation layer 116. The high-concentration doping area between the second channel area CA2 and the second third channel area CA3 may be the first node n1. That is, the first node n1 may connect the first terminal of the second transistor T2 to the second terminal of the third transistor T3.

The first layer electrode DCE may configure the second capacitor C2 along with the first electrode C2a and the second passivation layer 116. That is, the first layer electrode DCE may perform a function of the second electrode C2b configuring the second capacitor C2.

Subsequently, the third passivation layer 117 may be formed all over the substrate 10 to at least partially cover the first layer electrode DCE. The third passivation layer 117 may include SiOx, SiNx, or a multilayer thereof.

Finally, the first connection layer 118 may be provided in a pattern shape (for example, an island shape) on the third passivation layer 117. The first connection layer 118 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

The first connection layer 118 may include the first connection part CL1a, electrically connecting the second node n2 to the first terminal of the driving transistor Tdr included in the second pixel circuit layer 120, and a source/drain electrode SD connected to the first terminal of the third transistor T3.

The first connection part CL1a may be connected to a high-concentration doping area, provided between the first channel area CA1 and the second third channel area CA2, of the first semiconductor layer 112 through a first contact hole CH1 provided in the first gate insulation layer 113, the first passivation layer 115, the second passivation layer 116, and the third passivation layer 117. The high-concentration doping area between the first channel area CA1 and the second third channel area CA2 may be the second node n2.

The first terminal of the third transistor T3 may be connected to the source/drain electrode SD through a fourth contact hole CH4 provided in the first gate insulation layer 113, the first passivation layer 115, the second passivation layer 116, and the third passivation layer 117.

Figure 8:
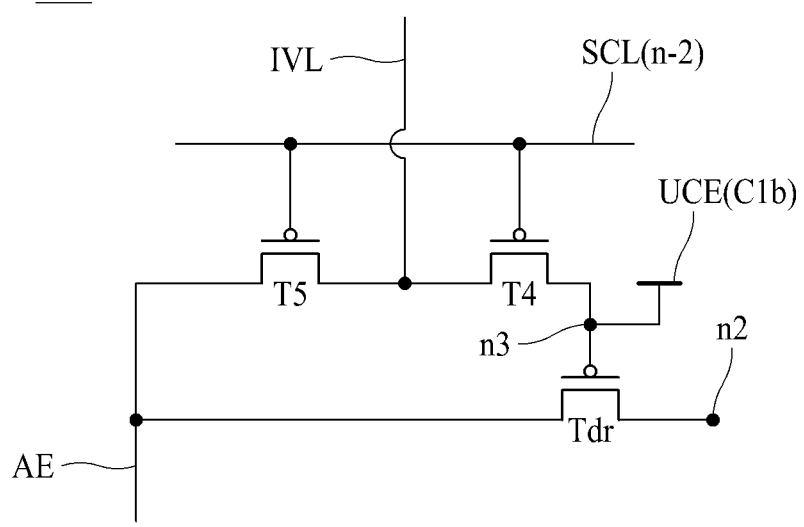
FIG. 8 is a diagram illustrating a second pixel circuit illustrated in FIG. 2.
Figure 9:
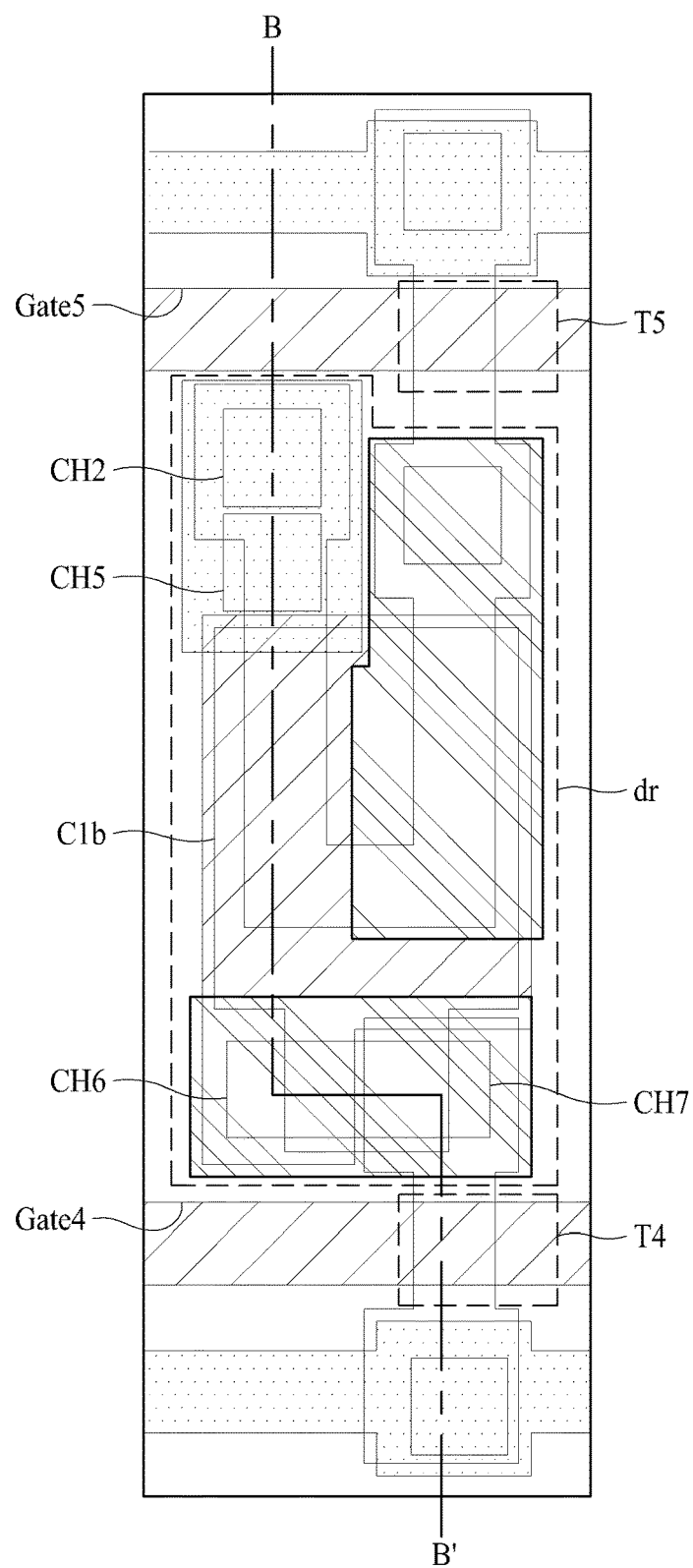
FIG. 9 is a diagram illustrating a layout of a second pixel circuit layer including the second pixel circuit illustrated in FIG. 8.
Figure 10:
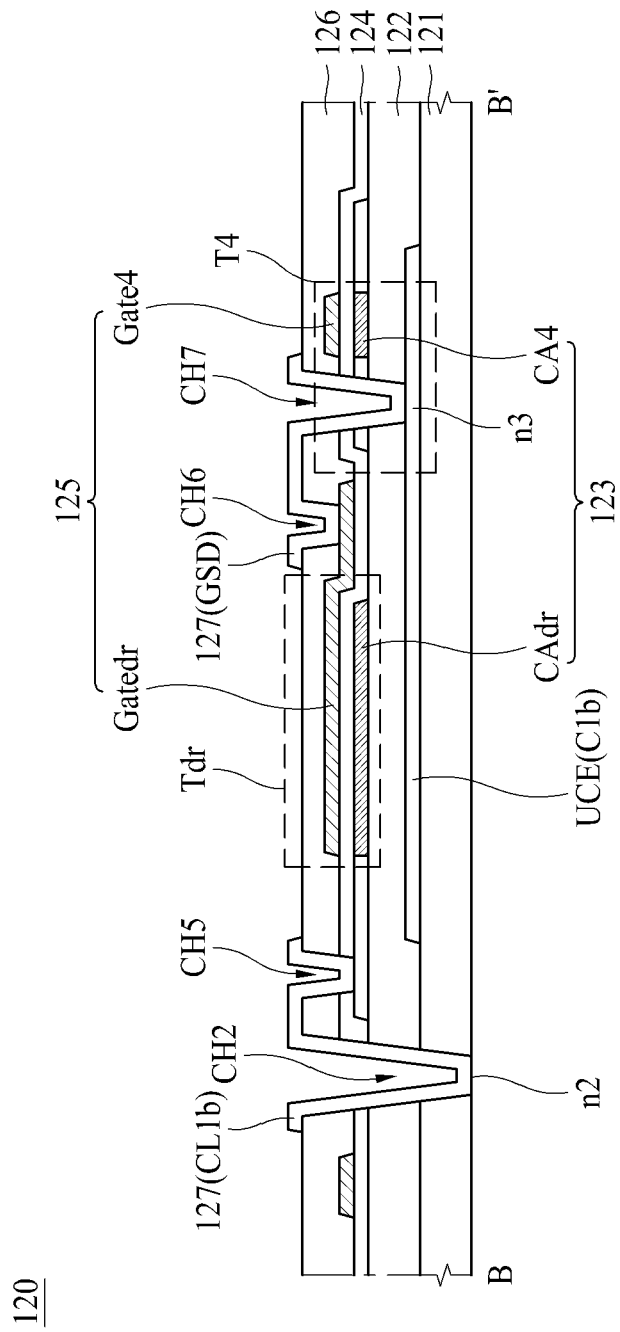
FIG. 10 is a cross-sectional view taken along line B-B' illustrated in FIG. 9.

FIG. 8 is a diagram illustrating a second pixel circuit illustrated in FIG. 2, FIG. 9 is a diagram illustrating a layout of a second pixel circuit layer including the second pixel circuit illustrated in FIG. 8, and FIG. 10 is a cross-sectional view taken along line B-B' illustrated in FIG. 9. That is, FIG. 8 illustrates a second pixel circuit PC2 included in one pixel, FIG. 9 illustrates a horizontal structure of the second pixel circuit layer 120 in one pixel, and FIG. 10 illustrates a vertical structure of the second pixel circuit layer 120 in one pixel.

In a light emitting display panel according to an embodiment of the present disclosure, as illustrated in FIGS. 8 to 10, the second pixel circuit layer 120 may include a fourth passivation layer (hereinafter referred to as an upper end passivation layer) 121 at least partially covering the first connection layer 118, a second layer electrode UCE formed in an island shape on the upper end passivation layer 121, a fifth passivation layer 122 at least partially covering the second layer electrode UCE, a second semiconductor layer 123 provided in a region, corresponding to the fourth and fifth transistors T4 and T5 and the driving transistor Tdr, of the fifth passivation layer 122, a second gate insulation layer 124 at least partially covering the second semiconductor layer 123, a second gate electrode layer 125 formed in an island shape in a region, corresponding to the fourth and fifth transistors T4 and T5 and the driving transistor Tdr, of the second gate insulation layer 124, a sixth passivation layer 126 at least partially covering the second gate electrode layer 125, and a second connection part CL1*b* formed in an island shape on the sixth passivation layer 126 and connected to the first pixel circuit layer 110. The second connection part CL1*b* may be included in a second connection layer 127.

First, the fourth passivation layer 121 may be formed all over the substrate 10 to at least partially cover the first connection layer 118 included in the first pixel circuit layer 110. In the second pixel circuit layer 120, the fourth passivation layer 121 may perform a function of a base substrate. The fourth passivation layer 121 may include SiOx, SiNx, or a multilayer thereof.

Subsequently, the second layer electrode UCE may be provided in a pattern shape (for example, an island shape) on the second passivation layer 116. The second layer electrode UCE may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

The second layer electrode UCE may configure the first capacitor C1 along with the first layer electrode DCE, the third passivation layer (the lower end passivation layer) 117, and the fourth passivation layer (the upper end passivation layer) 121, which are included in the first pixel circuit layer 110.

That is, the second layer electrode UCE may be the fourth electrode C1*b* of the first capacitor C1.

In this case, the first layer electrode DCE may configure the second capacitor C2 along with the first electrode C2*a* and may configure the first capacitor C1 along with the second layer electrode UCE.

To provide an additional description, the first layer electrode DCE included in the first pixel circuit layer 110 may perform a function of the second electrode C2*b* and may perform a function of the third electrode C1*a*.

The second layer electrode UCE may be disposed under the driving transistor Tdr and may perform a function of a blocking layer. That is, the second layer electrode UCE may decrease a parasitic capacitance between metal lines disposed under the second layer electrode UCE and the driving transistor Tdr provided on the second layer electrode UCE.

Subsequently, the fifth passivation layer 122 may be formed all over the substrate 10 to cover the second layer electrode UCE. The fifth passivation layer 122 may include SiOx, SiNx, or a multilayer thereof.

Subsequently, the second semiconductor layer 123 may be provided in an area where the fourth transistor T4, the fifth transistor T5, and the driving transistor Tdr are disposed. The second semiconductor layer 123 may include a polysilicon material.

The second semiconductor layer 123 according to an embodiment may include a plurality of high-concentration doping areas respectively provided in both ends of a fourth channel area CA4, a fifth channel area, a driving channel area CAdr, and a fourth channel area CA4, which are apart from one another, and moreover, may include a plurality of high-concentration doping areas respectively provided in both ends of the fifth channel area and a plurality of high-concentration doping areas respectively provided in both ends of the driving channel area CAdr.

The fourth channel area CA4 may be used as a semiconductor layer of the fourth transistor T4, the fifth channel area may be used as a semiconductor layer of the fifth transistor T5, and the driving channel area CAdr may be used as a semiconductor layer of the driving transistor Tdr.

The high-concentration doping areas may include metal properties. Therefore, a plurality of high-concentration doping areas respectively provided in both ends of the fourth transistor T4 may be used as the first terminal and the second terminal of the fourth transistor T4, a plurality of high-concentration doping areas respectively provided in both ends of the fifth transistor T5 may be used as the first terminal and the second terminal of the fifth transistor T5, and a plurality of high-concentration doping areas respectively provided in both ends of the driving transistor Tdr may be used as the first terminal and the second terminal of the driving transistor Tdr.

For example, in FIG. 10, a high-concentration doping area provided to the left of the driving channel area CAdr may be the first terminal of the driving transistor Tdr, and a high-concentration doping area provided to the right of the driving channel area CAdr may be the second terminal of the driving transistor Tdr.

Moreover, in FIG. 10, a high-concentration doping area provided to the left of the fourth channel area CA4 may be the second terminal of the fourth transistor T4, and a high-concentration doping area provided to the right of the fourth channel area CA4 may be the first terminal of the fourth transistor T4.

That is, as described above with reference to FIG. 2, the first terminal of the driving transistor Tdr may be connected to the second terminal of the first transistor T1 and the second terminal of the second transistor T2, and the second terminal of the driving transistor Tdr may be connected to the second terminal of the fifth transistor T5 and the light emitting device ED.

Moreover, the first terminal of the fourth transistor T4 may be connected to the initialization voltage line IVL, and the second terminal of the fourth transistor T4 may be connected to the driving gate electrode Gatedr of the driving transistor Tdr.

In this case, because the second terminal of the fourth transistor T4 is connected to the driving gate electrode Gatedr of the driving transistor Tdr, the fourth channel area CA4 may not directly be connected to the driving channel area CAdr.

The first terminal of the fifth transistor T5 may be electrically connected to the first terminal of the fourth transistor T4. Therefore, a high-concentration doping area forming the first terminal of the fifth channel area forming the fifth transistor T5 may be connected to a high-concentration doping area forming the first terminal of the fourth channel area CA4 forming the fourth transistor T4.

Subsequently, the second gate insulation layer 124 may be formed all over the substrate 10 to cover the second semiconductor layer 123. The second gate insulation layer 124 according to an embodiment may include SiOx, SiNx, or a multilayer thereof.

Subsequently, the second gate electrode layer 125 may be provided in an independent pattern shape (for example, an island shape) on the second gate insulation layer 124. The second gate electrode layer 125 may include a driving gate electrode Gatedr provided in an area overlapping with the driving channel area CAr, a fourth gate electrode Gate4 provided in an area overlapping with the fourth channel area CA4, and a fifth gate electrode provided in an area overlapping with the fifth channel area.

The driving gate electrode Gatedr, the driving channel area CAdr, and a plurality of high-concentration doping areas disposed to the right and the left of the driving channel area CAdr may configure the driving transistor Tdr. The fourth gate electrode Gate4, the fourth channel area CA4, and a plurality of high-concentration doping areas disposed to the right and the left of the fourth channel area CA4 may configure the fourth transistor T4. The fifth gate electrode, the fifth channel area, and a plurality of high-concentration doping areas disposed to the right and the left of the fifth channel area may configure the fifth transistor T5.

The second gate electrode layer 125 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

Subsequently, the sixth passivation layer 126 may be formed all over the substrate 10 to cover the second gate electrode layer 125. The sixth passivation layer 126 may include SiOx, SiNx, or a multilayer thereof.

Finally, the second connection layer 127 may be provided in a pattern shape (for example, an island shape) on the sixth passivation layer 126. The second connection layer 127 may include one of metals such as molybdenum (Mo), aluminum (Al), chromium (Cr), gold (Au), titanium (Ti), nickel (Ni), neodymium (Nd), and copper (Cu) or a single layer or a multilayer including an alloy thereof.

The second connection layer 127 may include a second connection part CL1b, connecting the first terminal of the driving transistor Tdr to the first connection part CL1a included in the first pixel circuit layer 110, and a third connection part GSD connecting the driving gate electrode Gatedr of the driving transistor Tdr to the second terminal of the fourth transistor T4.

The second connection part CL1b may be connected to the first connection part CL1a, included in the first pixel circuit layer 110, through a second contact hole CH2 formed in the fourth passivation layer 121, the fifth passivation layer 122, the second gate insulation layer 124, and the sixth passivation layer 126. The first connection part CL1a may be connected to the second terminal of the first transistor T1.

Moreover, the second connection part CL1b may be connected to the first terminal of the driving transistor Tdr through a fifth contact hole CH5 formed in the second gate insulation layer 124 and the sixth passivation layer 126, and the first connection part CL1a may be connected to the second terminal of the first transistor T1. Therefore, the first terminal of the driving transistor Tdr may be electrically connected to the second terminal of the first transistor T1 by the first connection part CL1a and the second connection part CL1b.

The third connection part GSD may be connected to the driving gate electrode Gatedr of the driving transistor Tdr through a sixth contact hole CH6 formed in the second gate insulation layer 124, and moreover, may be connected to the second layer electrode UCE and the second terminal of the fourth transistor T4 through a seventh contact hole CH7 formed in the fifth passivation layer 122, the second semiconductor layer 123, the second gate insulation layer 124, and the sixth passivation layer 126.

Therefore, the second terminal of the fourth transistor T4, the second layer electrode UCE, and the driving gate electrode Gatedr of the driving transistor Tdr may be electrically connected to one another by the third connection part GSD.

The second connection layer 127 may be at least partially covered by the planarization layer 160.

The light emitting device layer 170 may be included in the planarization layer 160. The light emitting device layer 170 may be at least partially covered by the encapsulation layer 190.

That is, the light emitting display panel 100 according to the present disclosure may include the first pixel circuit layer 110, the second pixel circuit layer 120, and the light emitting device layer 170. In this case, the planarization layer 160 may be provided between the second pixel circuit layer 120 and the light emitting device layer 170, and the light emitting device layer 170 may be at least partially covered by the encapsulation layer 190.

Figure 11A:
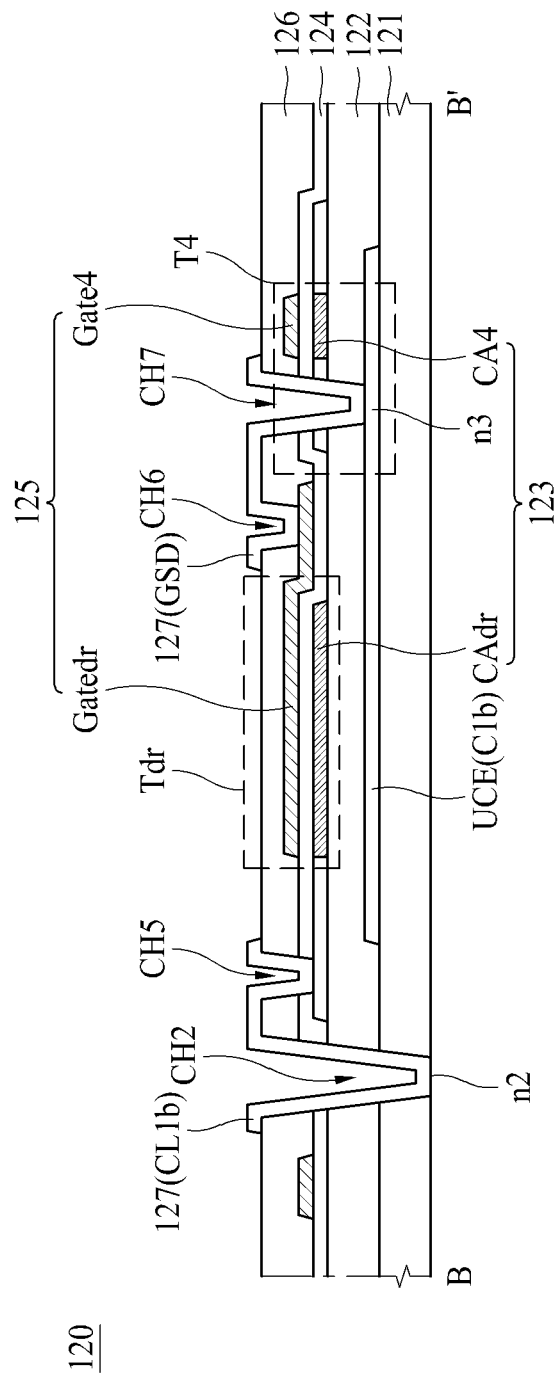
FIGS. 11A and 11B are an exploded cross-sectional views illustrating a first pixel circuit layer and a second pixel circuit layer, respectively, each configuring a light emitting display panel according to an embodiment of the present disclosure.
Figure 11B:
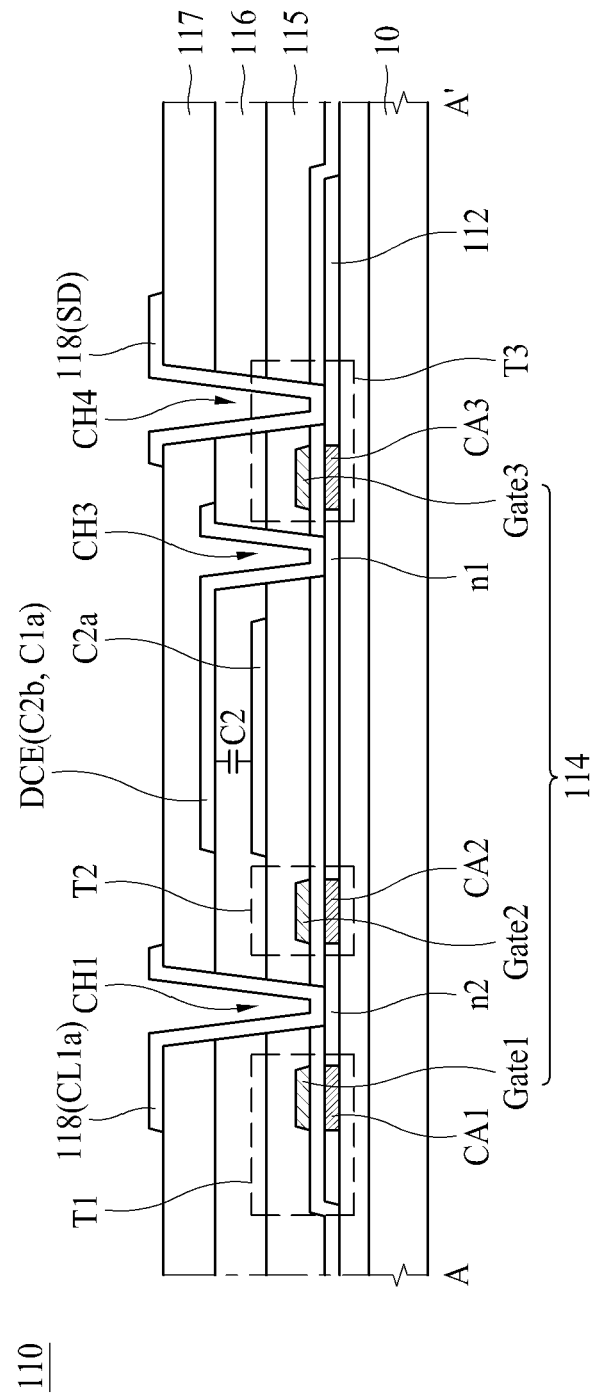
Figure 12:
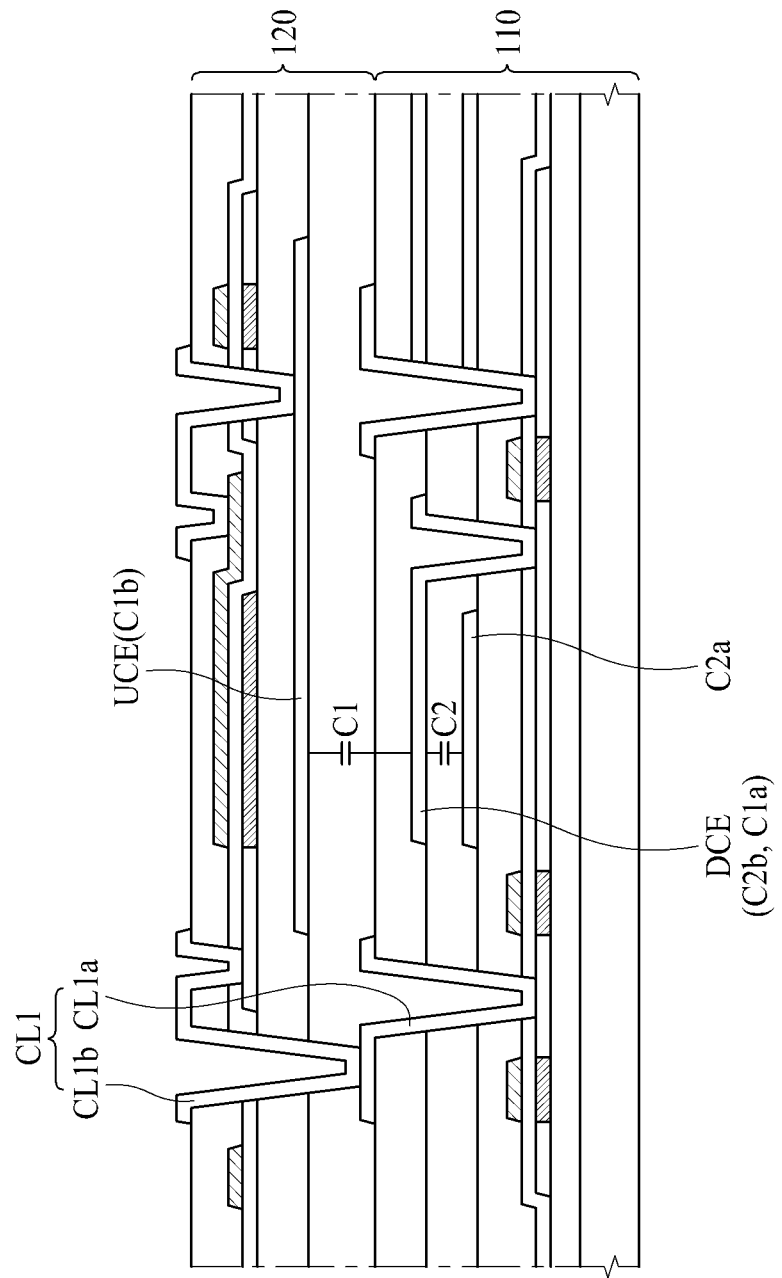
FIG. 12 is a cross-sectional view illustrating an example where a first pixel circuit layer and a second pixel circuit layer each illustrated in FIGS. 11A and 11B are coupled to each other.

FIGS. 11A and 11B are an exploded cross-sectional views illustrating a first pixel circuit layer and a second pixel circuit layer, respectively, each configuring a light emitting display panel according to an embodiment of the present disclosure, and FIG. 12 is a cross-sectional view illustrating an example where a first pixel circuit layer and a second pixel circuit layer each illustrated in FIGS. 11A and 11B are coupled to each other. That is, FIG. 11A illustrates a cross-sectional view of the first pixel circuit layer 110, and FIG. 11B illustrates a cross-sectional view of the second pixel circuit layer 120.

As described above, the light emitting display panel according to the present disclosure may include the first pixel circuit layer 110 including the first pixel circuit PC1 including the first layer electrode DCE, the second pixel circuit layer 120 including the second pixel circuit PC2 including the second layer electrode UCE which configures the first capacitor C1 along with the first layer electrode DCE, and the light emitting device layer 170 including the light emitting device ED electrically connected to the driving transistor Tdr included in the second pixel circuit layer 120.

The lower end passivation layer (the third passivation layer) 117 included in the first pixel circuit layer 110 and the upper end passivation layer (the fourth passivation layer) 121 included in the second pixel circuit layer 120 may be provided between the first layer electrode DCE and the second layer electrode UCE.

The first layer electrode DCE may configure the second capacitor C2 along with the first electrode C2a included in the first pixel circuit layer 110 and may configure the first capacitor C1 along with the second layer electrode UCE included in the second pixel circuit layer 120.

The first capacitor C1 and the second capacitor C2 may perform a function of storing the threshold voltage of the driving transistor Tdr, for internal compensation.

The first transistor T1 connected to the pixel driving voltage line PL and included in the first pixel circuit layer 110 may be connected to, through the connection line CL1, the driving transistor Tdr connected to the light emitting device ED and included in the second pixel circuit layer 120.

The connection line CL1 may include a first connection part CL1a, connected to the first transistor T1 through the first contact hole CH1 provided in the first pixel circuit layer 110, and a second connection part CL1b connected to the driving transistor Tdr through the second contact hole CH2 provided in the second pixel circuit layer 120. The first connection part CL1a may be connected to the second connection part CL1b.

In this case, the driving transistor Tdr may transfer, to the light emitting device ED, a current corresponding to a data voltage supplied from the first pixel circuit PC1.

The first pixel circuit PC1 may include the first layer electrode DCE, a first transistor T1 which includes a gate connected to the emission control line ECL and a first terminal connected to the pixel driving voltage line PL, a second transistor which includes a gate connected to the n-2$^{th}$ scan control line SCL(n-2) and a first terminal connected to the first layer electrode DCE, a third transistor T3 which includes a gate connected to the n$^{th}$ scan control line SCL(n), a first terminal connected to the data line DL, and a second terminal connected to the first layer electrode DCE, and a second capacitor C2 which includes a first terminal connected to the first terminal of the first transistor T1 and a second terminal connected to the first layer electrode DCE.

The second pixel circuit PC2 may include the second layer electrode UCE, the driving transistor Tdr which includes a gate connected to the second layer electrode UCE, a first terminal connected to the second terminal of the first transistor T1, and a second terminal connected to the light emitting device ED, a fourth transistor T4 which includes a gate connected to the n-2$^{th}$ scan control line SCL(n-2), a first terminal connected to the initialization voltage line IVL, and a second terminal connected to the second layer electrode UCE, and a fifth transistor T5 which includes a gate connected to the n-2$^{th}$ scan control line SCL(n-2), a first terminal connected to the initialization voltage line IVL, and a second terminal connected to the second terminal of the driving transistor Tdr.

The first pixel circuit layer 110 may include the substrate 10, the first semiconductor layer 112 formed in a region corresponding to the first to third transistors T1 to T3, the first gate insulation layer 113 at least partially covering the first semiconductor layer 112, the first gate electrode layer 114 formed in an island shape in a region, corresponding to the first to third transistors T1 to T3, of the first gate insulation layer 113, the first passivation layer 115 at least partially covering the first gate electrode layer 114, the first electrode C2a formed in an island shape on the first passivation layer 115, the second passivation layer 116 at least partially covering the first electrode C2a, the first layer electrode DCE formed in an island shape on the second passivation layer 116, the lower end passivation layer (the third passivation layer) 117 at least partially covering the first layer electrode DCE, and the first connection part CL1a formed in an island shape on the lower end passivation layer 117 and connected to the second pixel circuit layer 120.

The second pixel circuit layer 120 may include the upper end passivation layer (the fourth passivation layer) 121 at least partially covering the first connection part CL1a, the second layer electrode UCE formed in an island shape on the upper end passivation layer 121, the fifth passivation layer 122 at least partially covering the second layer electrode UCE, the second semiconductor layer 123 provided in a region, corresponding to the fourth and fifth transistors T4 and T5 and the driving transistor Tdr, of the fifth passivation layer 122, the second gate insulation layer 124 at least partially covering the second semiconductor layer 123, the second gate electrode layer 125 formed in an island shape in a region, corresponding to the fourth and fifth transistors T4 and T5 and the driving transistor Tdr, of the second gate insulation layer 124, the sixth passivation layer 126 at least partially covering the second gate electrode layer 125, and the second connection part CL1b formed in an island shape on the sixth passivation layer 126 and connected to the first pixel circuit layer 110.

In an embodiment of the present disclosure, it is described that all transistors included in the pixel driving circuit PDC are implemented as a P type, but the present disclosure is not limited thereto. Therefore, without departing from the technical feature of the present disclosure where an ultrahigh-resolution pixel is implemented by stacking two circuit layers, the transistors may all be modified into an N type, or some transistors may be modified into an N type.

A light emitting display apparatus, to which the present disclosure is applied, may be applied to portable electronic devices, requiring a high resolution, such as smartphones, mobile communication terminals, mobile phones, tablet personal computers (PCs), smart watches, watch phones, and wearable devices, appliances such as televisions, notebook computers, monitors, and refrigerators, and various products such as virtual image display apparatuses and head-mounted display apparatuses.

In the light emitting display panel according to the present disclosure, a pixel driving circuit included in each pixel may be implemented in a double-layer structure. Therefore, even in a case where a size of each pixel is reduced by realizing a high resolution, the pixel driving circuit may be sufficiently disposed in each pixel, thereby implementing a high-resolution light emitting display panel.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light emitting display panel comprising a plurality of pixels, wherein each of the plurality of pixels comprises:
   a first pixel circuit layer including a first pixel circuit having a first layer electrode;
   a second pixel circuit layer including a second pixel circuit including a driving transistor and a second layer electrode;
   a first capacitor having a first plate and a second plate, wherein the first plate includes the first layer electrode and the second plate includes the second layer electrode;
   a second capacitor having a third plate and a fourth plate, wherein the third plate includes the first layer electrode and the fourth plate includes a first electrode provided in the first pixel circuit layer; and
   a light emitting device layer including a light emitting device electrically connected to the driving transistor provided in the second pixel circuit layer.

2. The light emitting display panel of claim 1, further comprising:
   a lower end passivation layer provided in the first pixel circuit layer and between the first layer electrode and the second layer electrode; and
   an upper end passivation layer provided in the second pixel circuit layer and between the first layer electrode and the second layer electrode.

3. The light emitting display panel of claim 1, wherein the first capacitor and the second capacitor store a threshold voltage of the driving transistor, for internal compensation.

4. The light emitting display panel of claim 1, wherein a first transistor connected to a pixel driving voltage line and provided in the first pixel circuit layer is connected to, through a connection line, the driving transistor connected to the light emitting device and provided in the second pixel circuit layer.

5. The light emitting display panel of claim 4, wherein the connection line comprises:
   a first connection part connected to the first transistor through a first contact hole provided in the first pixel circuit layer; and
   a second connection part connected to the driving transistor through a second contact hole provided in the second pixel circuit layer, and
   the first connection part is connected to the second connection part.

6. The light emitting display panel of claim 1, wherein the driving transistor transfers, to the light emitting device, a current corresponding to a data voltage supplied from the first pixel circuit.

7. The light emitting display panel of claim 1, wherein the first pixel circuit comprises:
   the first layer electrode;
   a first transistor including a gate connected to an emission control line and a first terminal connected to a pixel driving voltage line;
   a second transistor including a gate connected to an $n-2^{th}$ scan control line and a first terminal connected to the first layer electrode;
   a third transistor including a gate connected to an $n^{th}$ scan control line, a first terminal connected to a data line, and a second terminal connected to the first layer electrode; and
   a second capacitor including a first terminal connected to the first terminal of the first transistor and a second terminal connected to the first layer electrode.

8. The light emitting display panel of claim 7, wherein the second pixel circuit comprises:
   the second layer electrode;
   the driving transistor including a gate connected to the second layer electrode, a first terminal connected to the second terminal of the first transistor, and a second terminal connected to the light emitting device;
   a fourth transistor including a gate connected to the $n-2^{th}$ scan control line, a first terminal connected to an initialization voltage line, and a second terminal connected to the second layer electrode; and
   a fifth transistor including a gate connected to the $n-2^{th}$ scan control line, a first terminal connected to the initialization voltage line, and a second terminal connected to the second terminal of the driving transistor.

9. The light emitting display panel of claim 1, wherein the first pixel circuit layer comprises:
   a substrate;
   a first semiconductor layer formed in a region corresponding to first to third transistors;
   a first gate insulation layer at least partially covering the first semiconductor layer;
   a first gate electrode layer formed in an island shape in a region, corresponding to the first to third transistors, of the first gate insulation layer;
   a first passivation layer at least partially covering the first gate electrode layer;
   a first electrode formed in an island shape on the first passivation layer;
   a second passivation layer at least partially covering the first electrode;
   the first layer electrode formed in an island shape on the second passivation layer;
   a lower end passivation layer at least partially covering the first layer electrode; and
   a first connection part formed in an island shape on the lower end passivation layer and connected to the second pixel circuit layer.

10. The light emitting display panel of claim 9, wherein the second pixel circuit layer comprises:
    an upper end passivation layer at least partially covering the first connection part;
    the second layer electrode formed in an island shape on the upper end passivation layer;
    a fifth passivation layer at least partially covering the second layer electrode;
    a second semiconductor layer formed in a region, corresponding to fourth and fifth transistors and the driving transistor, of the fifth passivation layer;
    a second gate insulation layer at least partially covering the second semiconductor layer;
    a second gate electrode layer formed in an island shape in a region, corresponding to the fourth and fifth transistors and the driving transistor, of the second gate insulation layer;
    a sixth passivation layer at least partially covering the second gate electrode layer; and
    a second connection part formed in an island shape on the sixth passivation layer and connected to the first pixel circuit layer.

11. A display device, comprising:
a display panel including a plurality of pixels, wherein each of the plurality of pixels comprises:
- a first pixel circuit layer including a first pixel circuit having a first layer electrode;
- a second pixel circuit layer including a second pixel circuit including a second layer electrode which configures a first capacitor along with the first layer electrode; and
- a light emitting device layer including a light emitting device electrically connected to a driving transistor provided in the second pixel circuit layer,
wherein a first transistor connected to a pixel driving voltage line and provided in the first pixel circuit layer is connected to, through a connection line, the driving transistor connected to the light emitting device and provided in the second pixel circuit layer.

12. The display device of claim 11, wherein the display panel further comprising:
- a lower end passivation layer provided in the first pixel circuit layer and between the first layer electrode and the second layer electrode; and
- an upper end passivation layer provided in the second pixel circuit layer and between the first layer electrode and the second layer electrode.

13. The display device of claim 11, wherein the first layer electrode configures a second capacitor along with a first electrode provided in the first pixel circuit layer.

14. The display device of claim 13, wherein the first capacitor and the second capacitor store a threshold voltage of the driving transistor, for internal compensation.

15. The display device of 11, wherein the connection line comprises:
- a first connection part connected to the first transistor through a first contact hole provided in the first pixel circuit layer; and
- a second connection part connected to the driving transistor through a second contact hole provided in the second pixel circuit layer, and
- the first connection part is connected to the second connection part.

16. The display device of claim 11, wherein the first pixel circuit comprises:
- the first layer electrode;
- a first transistor including a gate connected to an emission control line and a first terminal connected to a pixel driving voltage line;
- a second transistor including a gate connected to an n-2$^{th}$ scan control line and a first terminal connected to the first layer electrode;
- a third transistor including a gate connected to an n$^{th}$ scan control line, a first terminal connected to a data line, and a second terminal connected to the first layer electrode; and
- a second capacitor including a first terminal connected to the first terminal of the first transistor and a second terminal connected to the first layer electrode.

17. The display device of claim 16, wherein the second pixel circuit comprises:
- the second layer electrode;
- the driving transistor including a gate connected to the second layer electrode, a first terminal connected to the second terminal of the first transistor, and a second terminal connected to the light emitting device;
- a fourth transistor including a gate connected to the n-2$^{th}$ scan control line, a first terminal connected to an initialization voltage line, and a second terminal connected to the second layer electrode; and
- a fifth transistor including a gate connected to the n-2$^{th}$ scan control line, a first terminal connected to the initialization voltage line, and a second terminal connected to the second terminal of the driving transistor.

18. The display device of claim 11, wherein the second pixel circuit comprises:
- an upper end passivation layer at least partially covering the first connection part;
- a second layer electrode formed in an island shape on the upper end passivation layer;
- a fifth passivation layer at least partially covering the second layer electrode;
- a second semiconductor layer formed in a region, corresponding to fourth and fifth transistors and the driving transistor, of the fifth passivation layer;
- a second gate insulation layer at least partially covering the second semiconductor layer;
- a second gate electrode layer formed in an island shape in a region, corresponding to the fourth and fifth transistors and the driving transistor, of the second gate insulation layer;
- a sixth passivation layer at least partially covering the second gate electrode layer; and
- a second connection part formed in an island shape on the sixth passivation layer and connected to the first pixel circuit layer.

* * * * *